(12) United States Patent
Ikarashi et al.

(10) Patent No.: US 11,152,428 B2
(45) Date of Patent: Oct. 19, 2021

(54) SELECTION DEVICE AND STORAGE APPARATUS

(71) Applicant: SONY SEMICONDUCTOR SOLUTIONS CORPORATION, Kanagawa (JP)

(72) Inventors: Minoru Ikarashi, Kanagawa (JP); Takeyuki Sone, Kanagawa (JP); Seiji Nonoguchi, Kanagawa (JP); Hiroaki Sei, Kanagawa (JP); Kazuhiro Ohba, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/607,764

(22) PCT Filed: Apr. 6, 2018

(86) PCT No.: PCT/JP2018/014717
§ 371 (c)(1),
(2) Date: Oct. 24, 2019

(87) PCT Pub. No.: WO2018/203459
PCT Pub. Date: Nov. 8, 2018

(65) Prior Publication Data
US 2020/0052036 A1    Feb. 13, 2020

(30) Foreign Application Priority Data

May 1, 2017  (JP) .............................. JP2017-091113

(51) Int. Cl.
H01L 27/24    (2006.01)
H01L 45/00    (2006.01)
(Continued)

(52) U.S. Cl.
CPC .......... *H01L 27/2427* (2013.01); *G11C 5/063* (2013.01); *H01L 27/2481* (2013.01);
(Continued)

(58) Field of Classification Search
CPC . G11C 5/063; G11C 11/1659; G11C 13/0004; G11C 13/003; G11C 2213/76;
(Continued)

(56) References Cited

U.S. PATENT DOCUMENTS

2007/0096248 A1   5/2007  Philipp et al.
2007/0099377 A1   5/2007  Happ et al.
(Continued)

FOREIGN PATENT DOCUMENTS

CN    101068024 A    11/2007
CN    101106152 A    1/2008
(Continued)

OTHER PUBLICATIONS

Adler, et al., "Threshold switching in chalcogenide-glass thin films", Journal of Applied Physics, vol. 51, No. 6, Jul. 9, 2008, pp. 3289-3309.
(Continued)

*Primary Examiner* — Galina G Yushina
(74) *Attorney, Agent, or Firm* — Chip Law Group

(57) ABSTRACT

There is provided a selection device that includes a first electrode, a second electrode opposed to the first electrode, a semiconductor layer provided between the first electrode and the second electrode, and including at least one kind of chalcogen element selected from tellurium (Te), selenium (Se), and sulfur (S), and at least one kind of first element selected from boron (B), aluminum (Al), gallium (Ga), phosphorus (P), arsenic (As), carbon (C), germanium (Ge), and silicon (Si), and a first heat bypass layer provided at least in a portion around the semiconductor layer between the first
(Continued)

electrode and the second electrode and having higher thermal conductivity than the semiconductor layer.

4 Claims, 14 Drawing Sheets

(51) Int. Cl.
   *H01L 27/22* (2006.01)
   *G11C 5/06* (2006.01)
   *H01L 43/08* (2006.01)

(52) U.S. Cl.
   CPC .......... *H01L 45/06* (2013.01); *H01L 45/1253* (2013.01); *H01L 45/1293* (2013.01); *H01L 45/141* (2013.01); *H01L 45/148* (2013.01); *H01L 27/222* (2013.01); *H01L 43/08* (2013.01)

(58) Field of Classification Search
   CPC ............. H01L 27/2427; H01L 27/2481; H01L 27/224; H01L 27/2463; H01L 21/8239; H01L 45/1253; H01L 45/1293; H01L 45/141; H01L 45/148; H01L 45/067
   See application file for complete search history.

(56) References Cited

U.S. PATENT DOCUMENTS

| | | | |
|---|---|---|---|
| 2007/0181932 A1 | 8/2007 | Happ et al. | |
| 2007/0279974 A1* | 12/2007 | Dennison | G11C 13/0004 365/163 |
| 2009/0098681 A1 | 4/2009 | Sousa et al. | |
| 2010/0032637 A1 | 2/2010 | Kinoshita et al. | |
| 2012/0132879 A1 | 5/2012 | Kinoshita et al. | |
| 2013/0256624 A1 | 10/2013 | Kau | |
| 2016/0133671 A1 | 5/2016 | Fantini et al. | |
| 2016/0149127 A1 | 5/2016 | Kau | |
| 2016/0276022 A1* | 9/2016 | Redaelli | G11C 13/0004 |
| 2017/0243923 A1* | 8/2017 | Jeong | H01L 27/1026 |
| 2017/0331036 A1* | 11/2017 | Collins | H01L 45/144 |
| 2017/0358628 A1 | 12/2017 | Fantini et al. | |
| 2018/0033826 A1* | 2/2018 | Choi | H01L 45/1233 |

FOREIGN PATENT DOCUMENTS

| | | |
|---|---|---|
| CN | 101645453 A | 2/2010 |
| EP | 1780814 A2 | 5/2007 |
| EP | 1816679 A2 | 8/2007 |
| EP | 1816680 A1 | 8/2007 |
| EP | 2051309 A1 | 4/2009 |
| FR | 2922368 A1 | 4/2009 |
| JP | 2007-243169 A | 9/2007 |
| JP | 2007-243170 A | 9/2007 |
| JP | 2009-099990 A | 5/2009 |
| JP | 2010-040820 A | 2/2010 |
| JP | 2014-530491 A | 11/2014 |
| JP | 2017-537470 A | 12/2017 |
| WO | 2013/039496 A1 | 3/2013 |
| WO | 2016/073152 A1 | 5/2016 |

OTHER PUBLICATIONS

Gill, et al., "Ovonic Unified Memory—A High-Performance Non-volatile Memory Technology for Stand-Alone Memory and Embedded Applications", International Solid-State Circuits Conference. Digest of Technical Papers, IEEE, Catalog No. 02CH37315, Feb. 2002, 04 pages.

Rockstad, et al., "Electrical Stability of Bulk "S-Shaped" Negative Differential Conductivity Media", IEEE Transactions on Electron Devices, Jun. 1973, pp. 593-595.

Yasuhara, et al., "Inhomogeneous Chemical States in Resistance-Switching Devices with a Planar-Type Pt/CuO/Pt Structure", Applied Physics Letters, vol. 95, No. 012110, Jun. 2009, 03 pages.

Cheung, et al., "Extraction of Schottky diode parameters from forward current-voltage characteristics", Applied Physics Letters, vol. 49, No. 85, May 16, 1986, 04 pages.

Boer, et al., "Vorprozesse des Wärmedurchschlages. II. Zur Theorie der inhomogenen Stromverteilung bei hohen elektrischen Leistungen", Basic Solid State Physics, vol. 256, No. 12, 1961, pp. 231-242.

International Search Report and Written Opinion of PCT Application No. PCT/JP2018/014717, dated Jun. 19, 2018, 11 pages of ISRWO.

* cited by examiner

[FIG. 1]
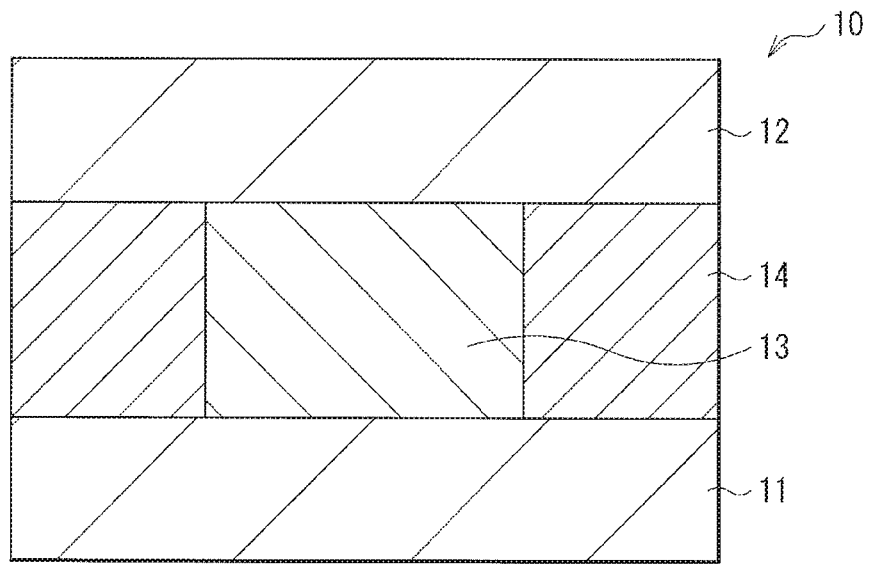
[FIG. 2]
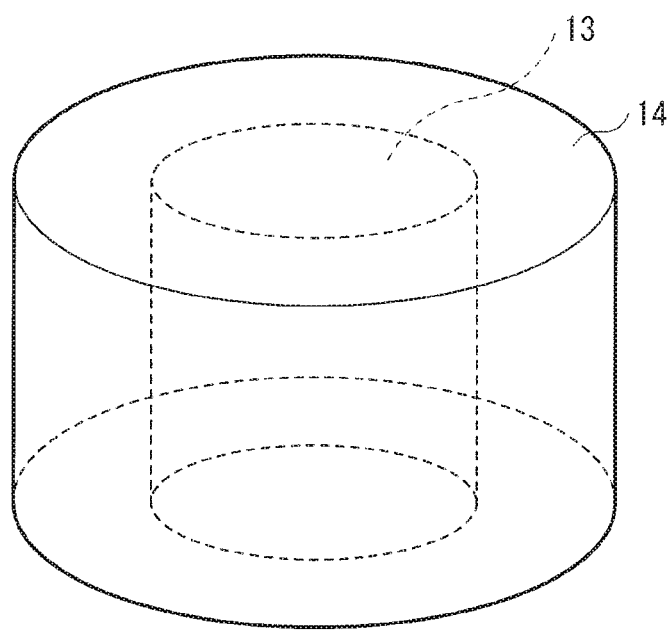

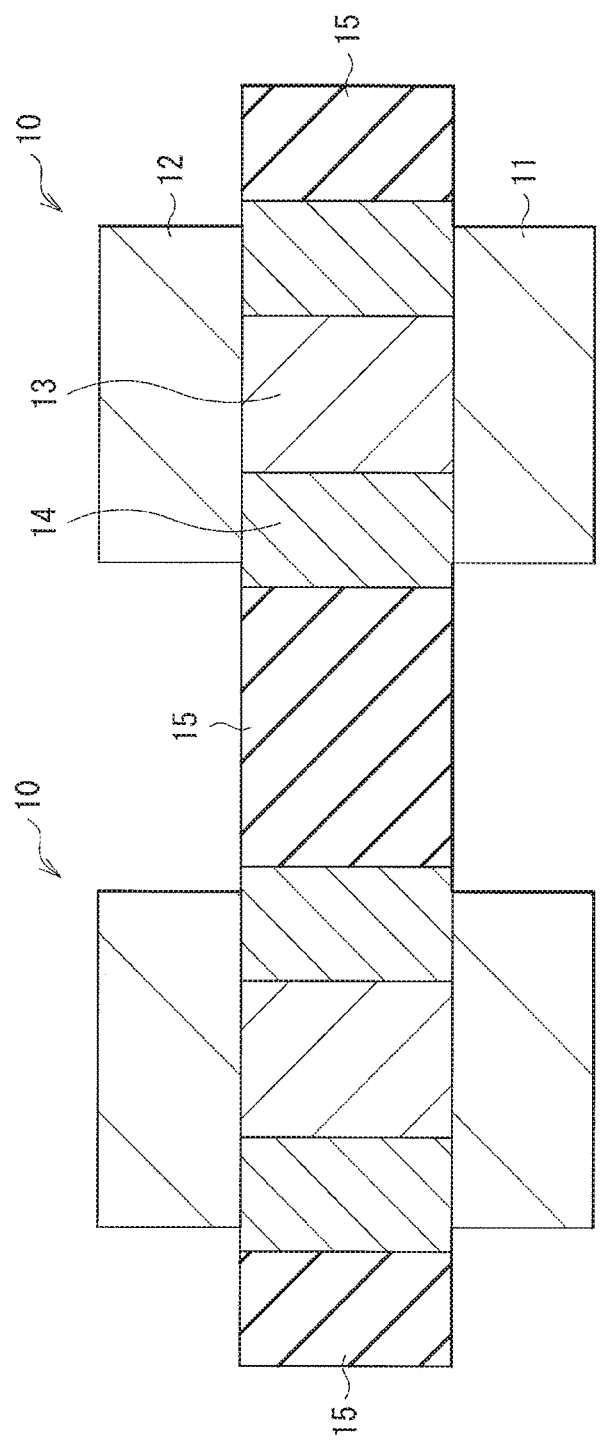
[FIG. 3]

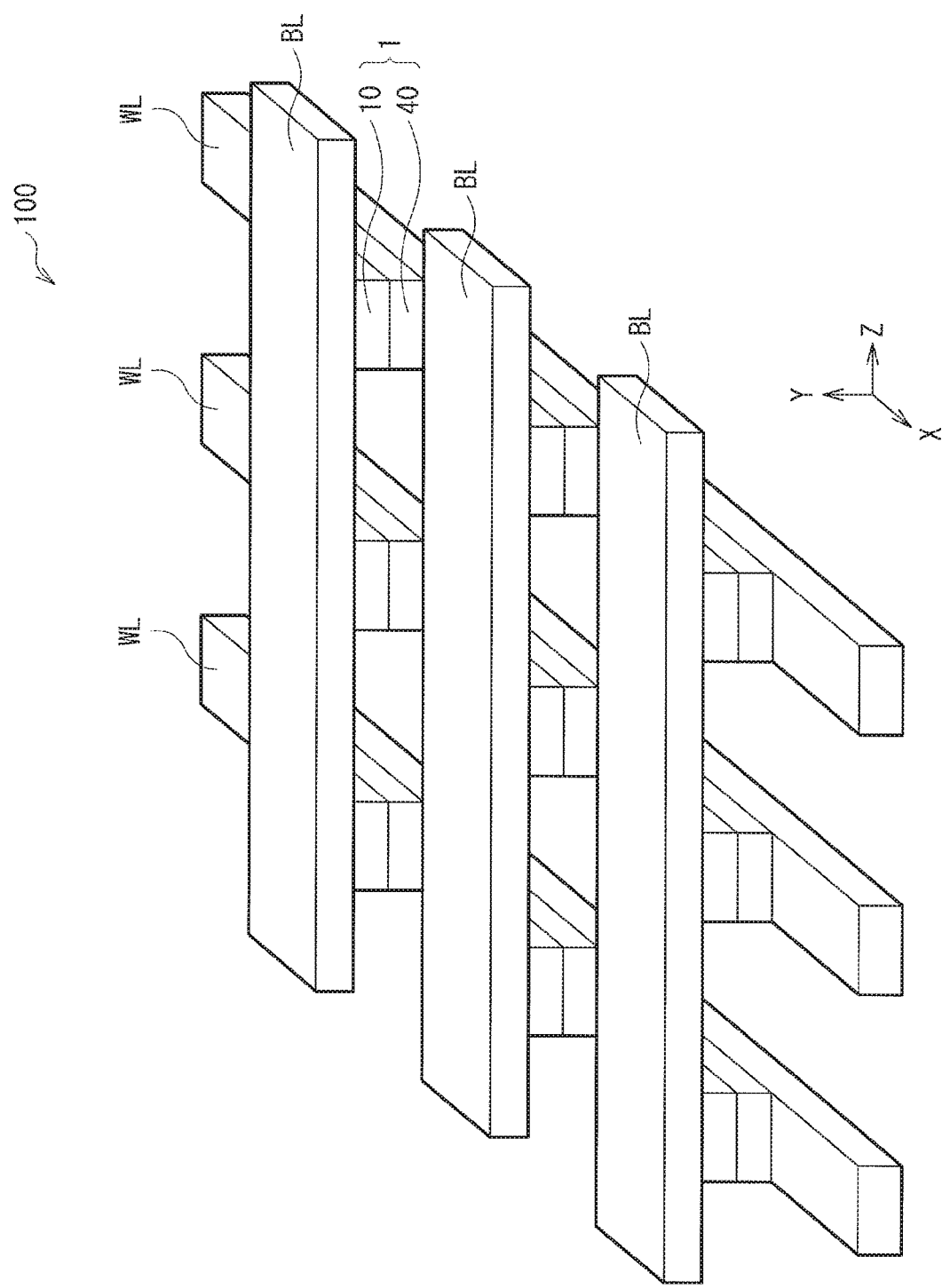
[FIG. 4]

[FIG. 5]
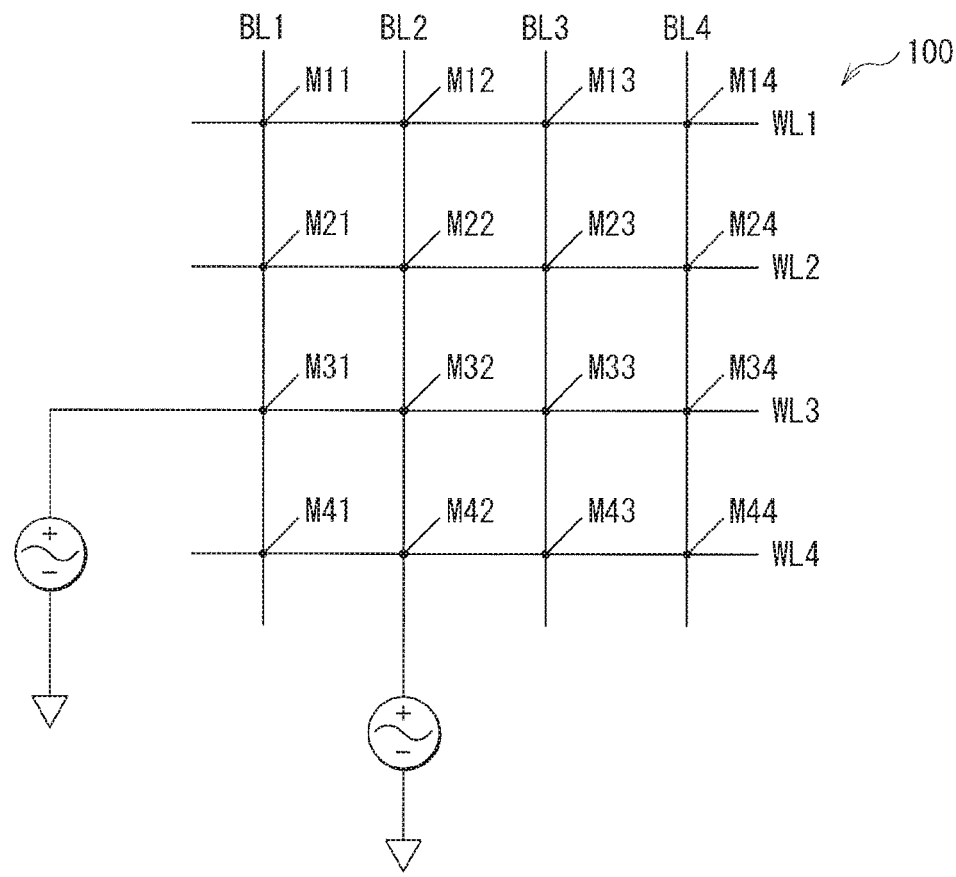
[FIG. 6]
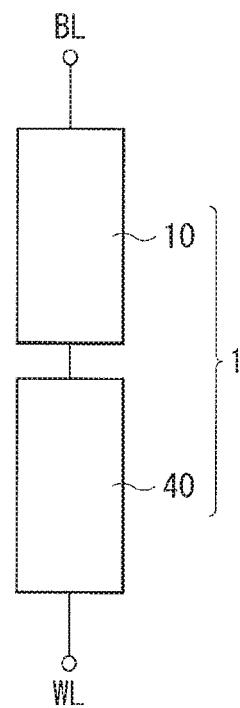

[FIG. 7]
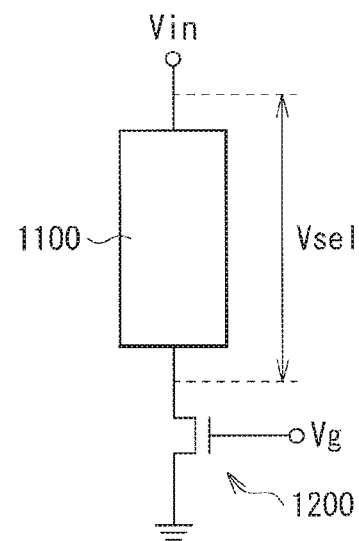
[FIG. 8]
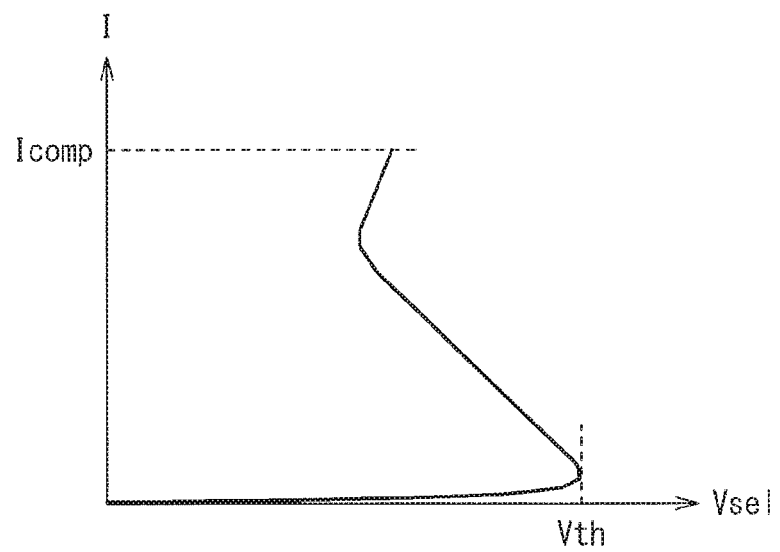

[ FIG. 9 ]
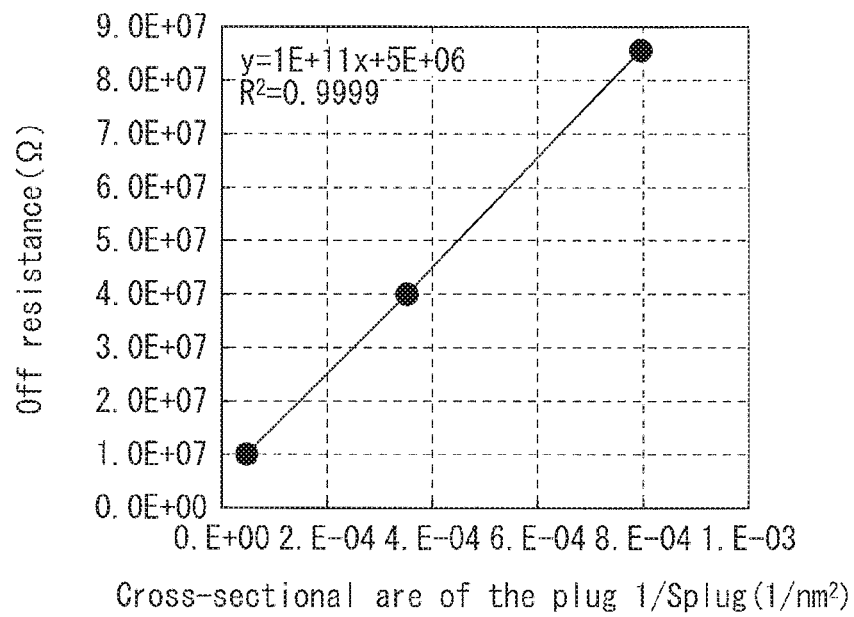
[ FIG. 10 ]
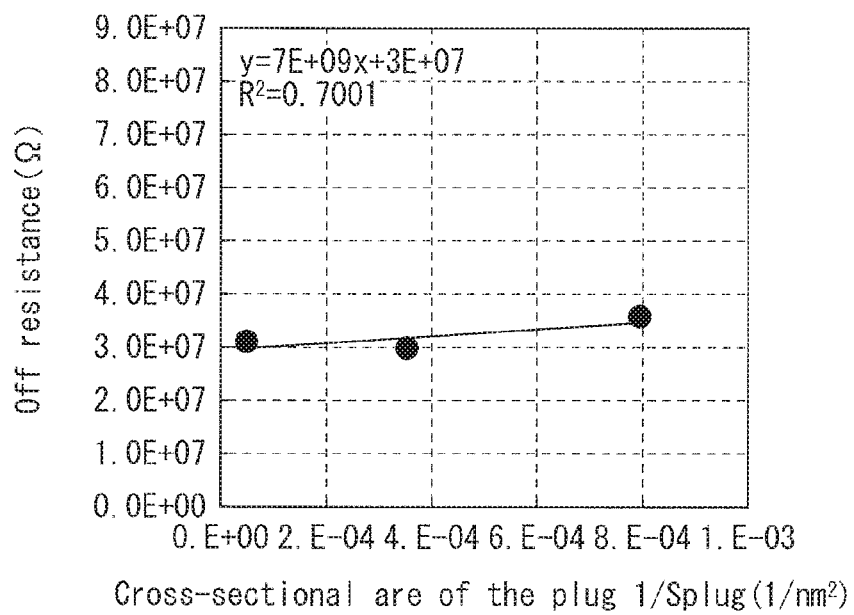

[FIG. 11]
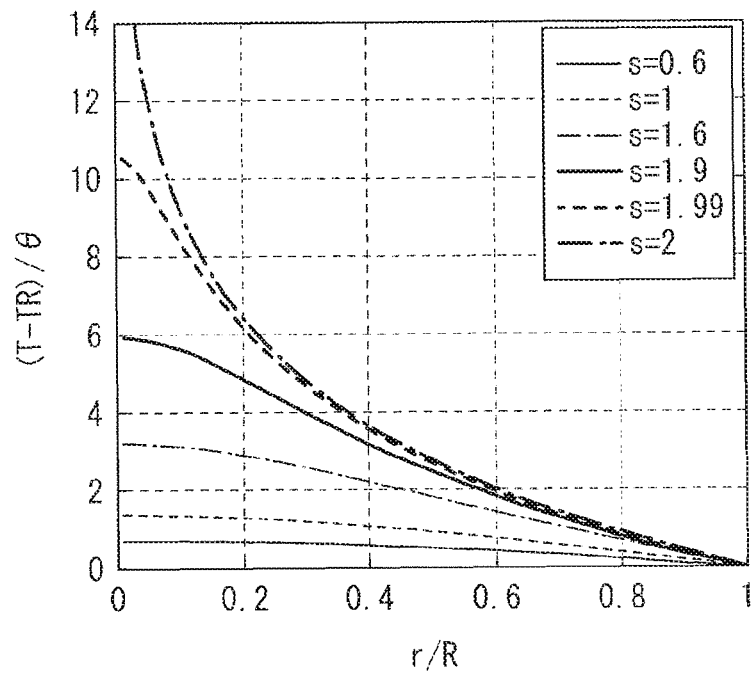
[FIG. 12]
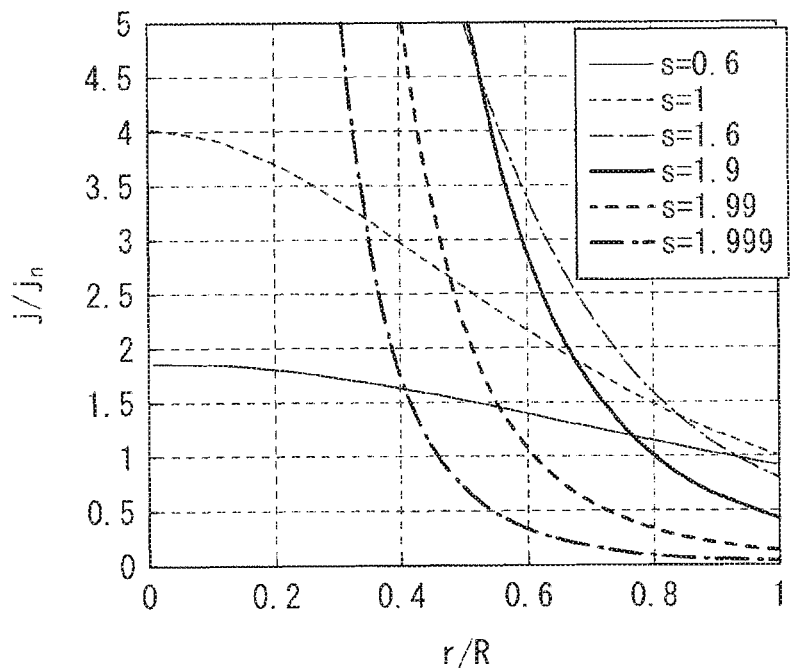

[FIG. 13]
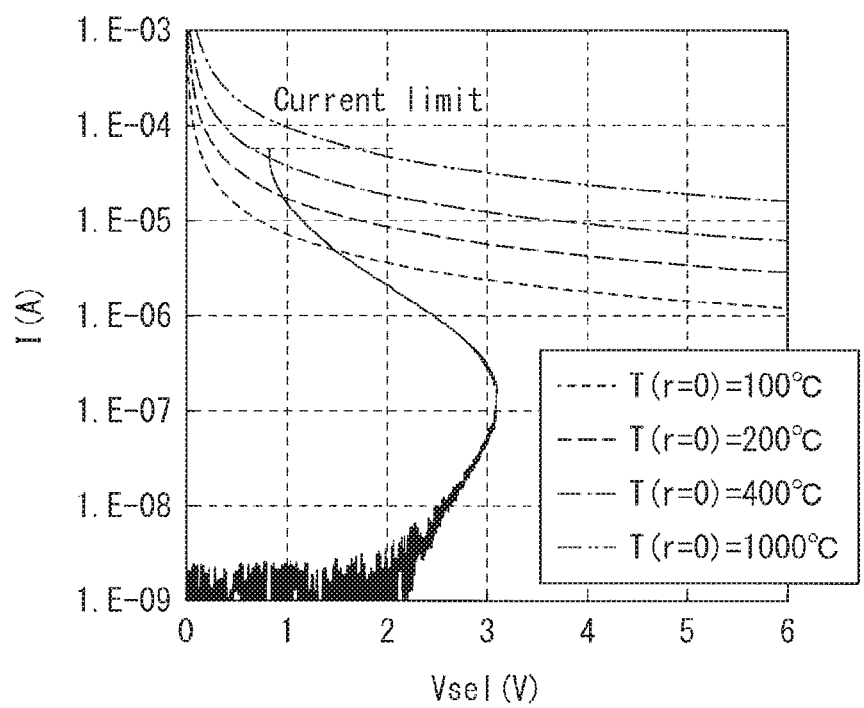
[FIG. 14]
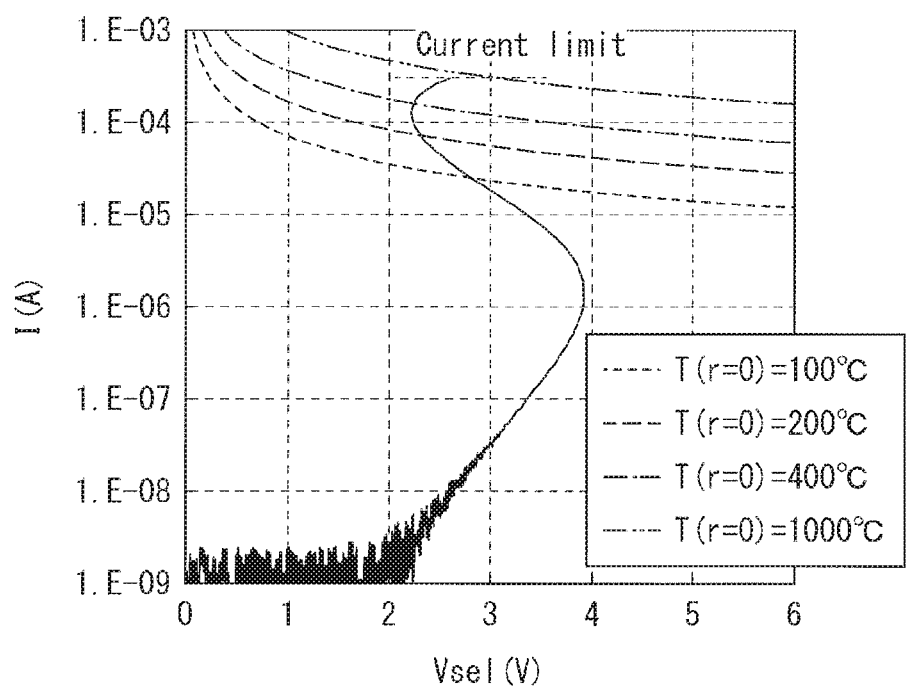

[ FIG. 15 ]
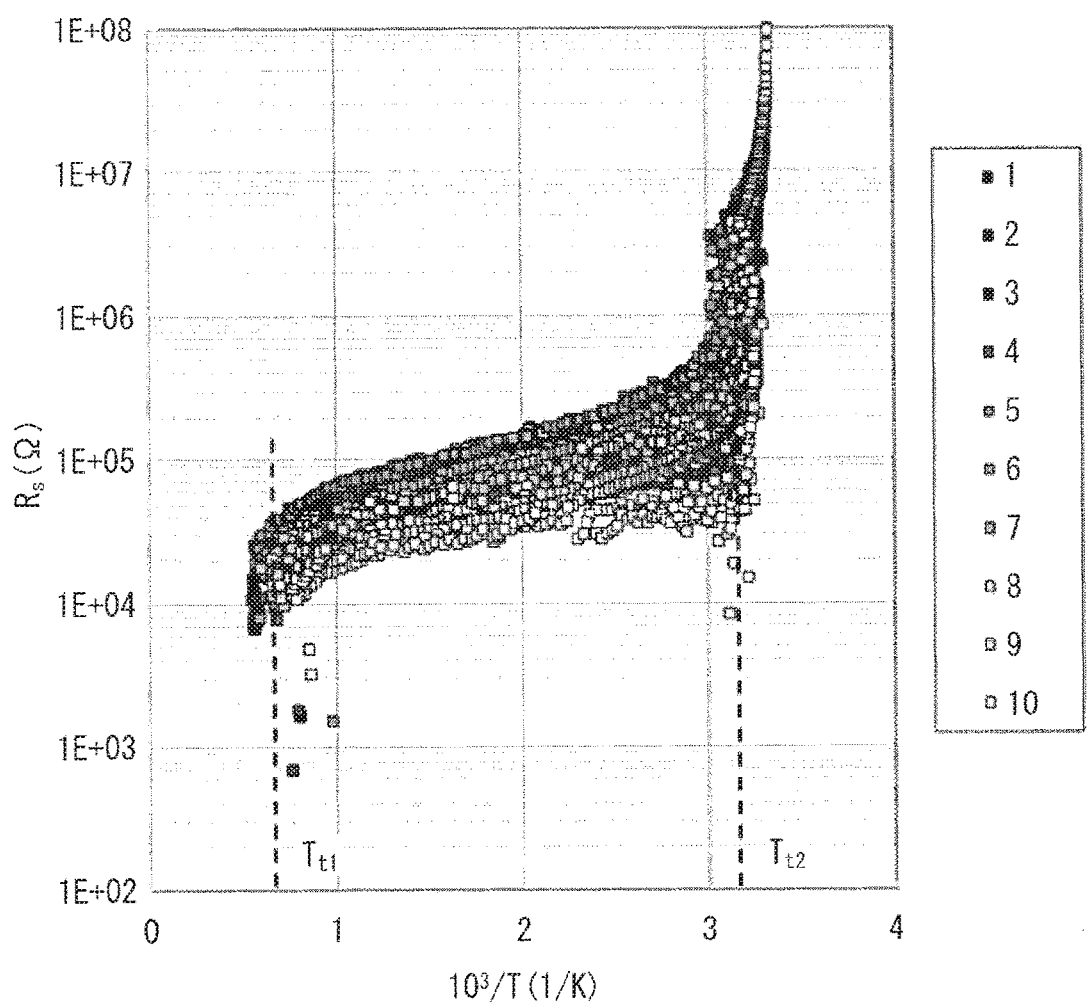

[ FIG. 16 ]
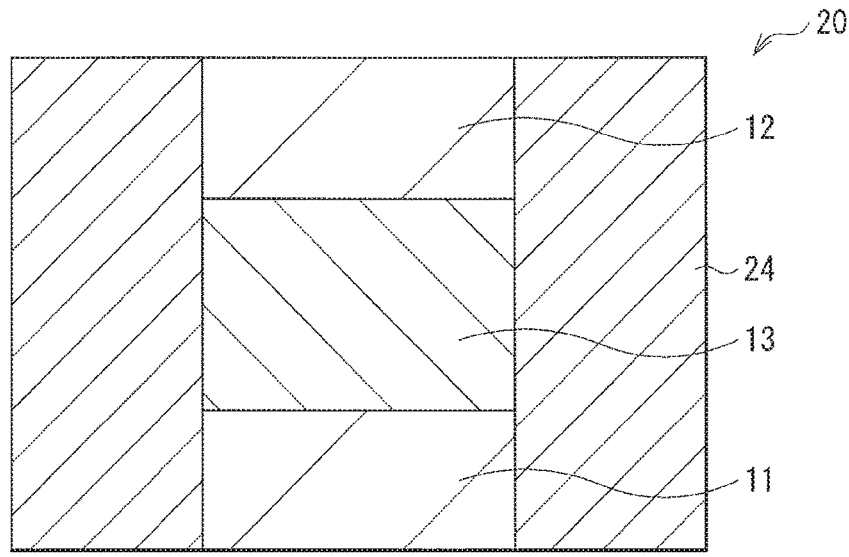
[ FIG. 17 ]
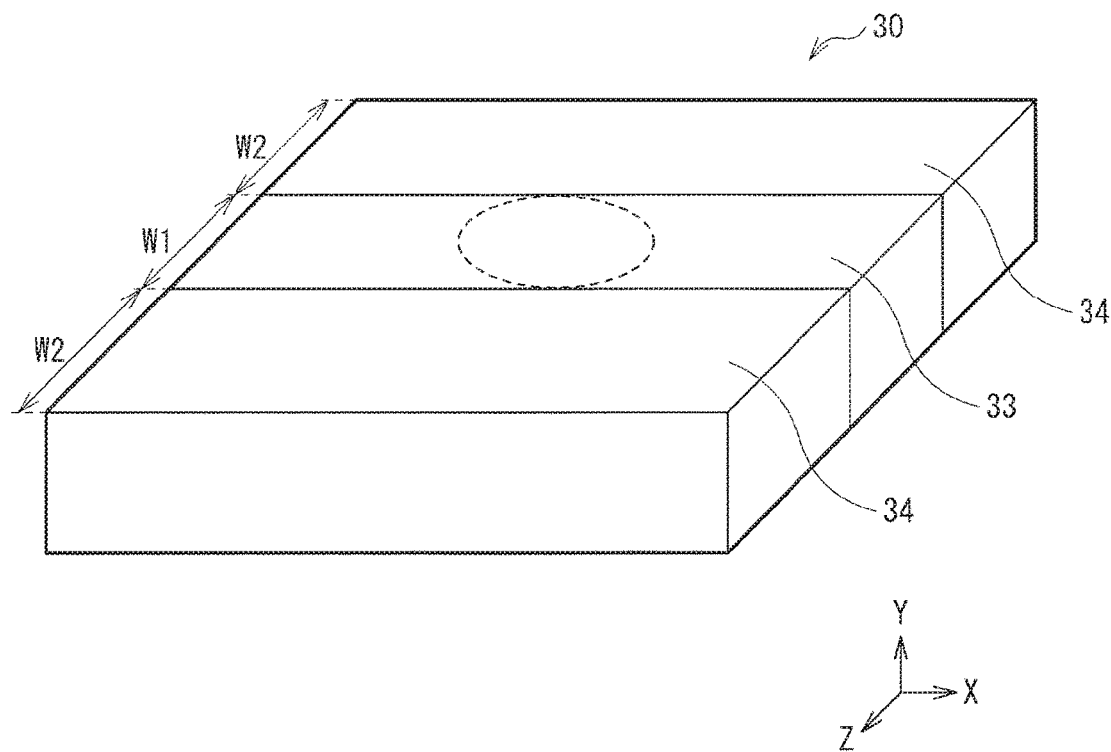

[ FIG. 18 ]
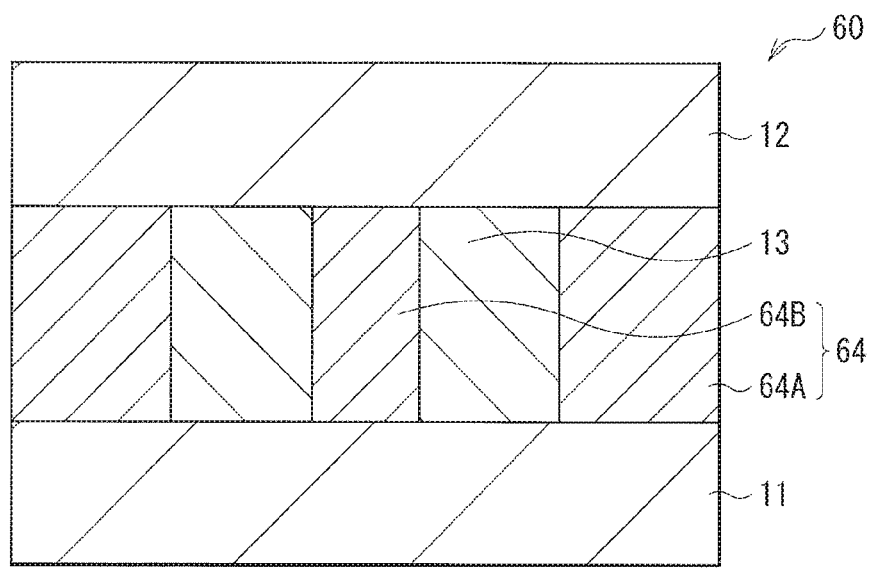

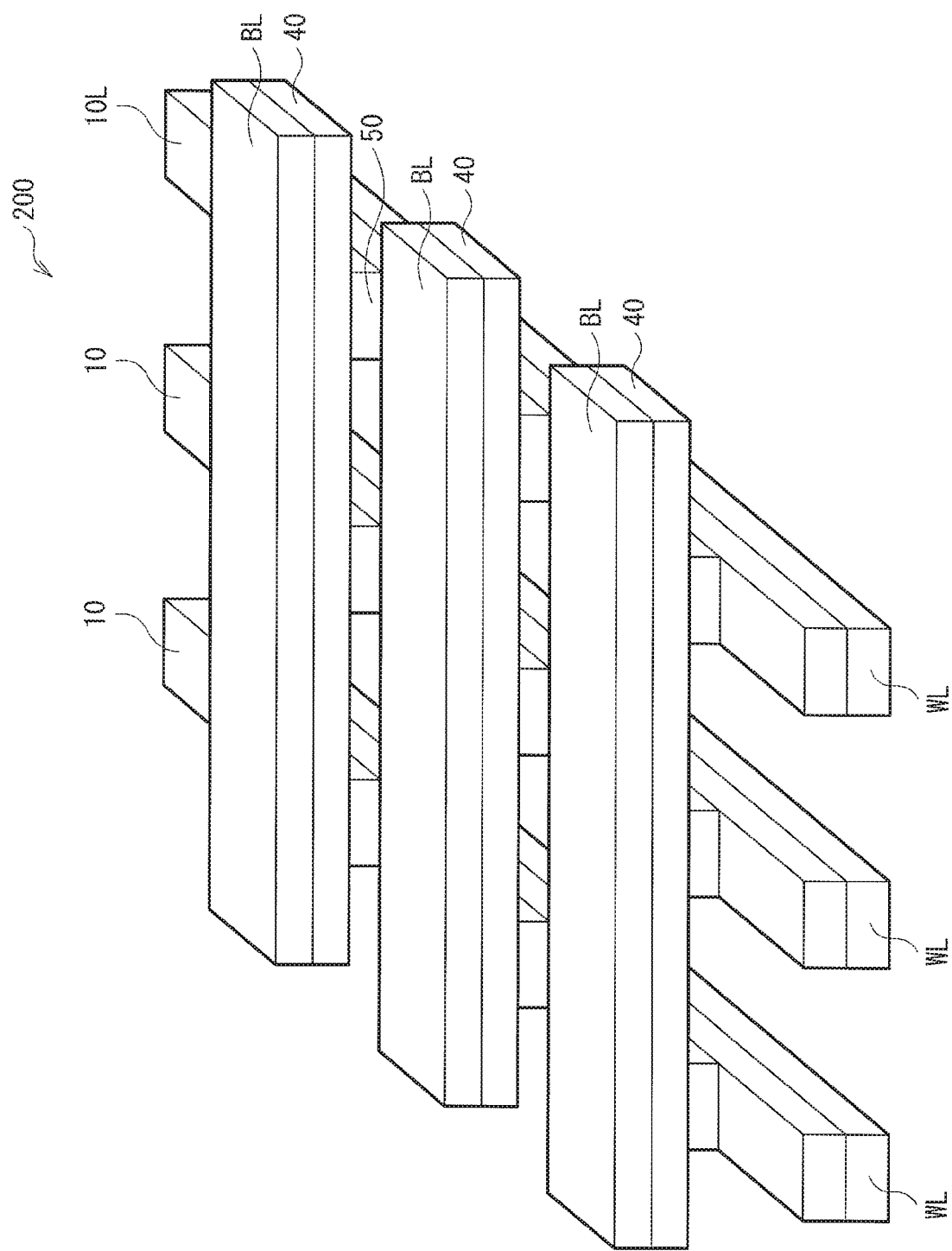
[FIG. 19]

[FIG. 20]
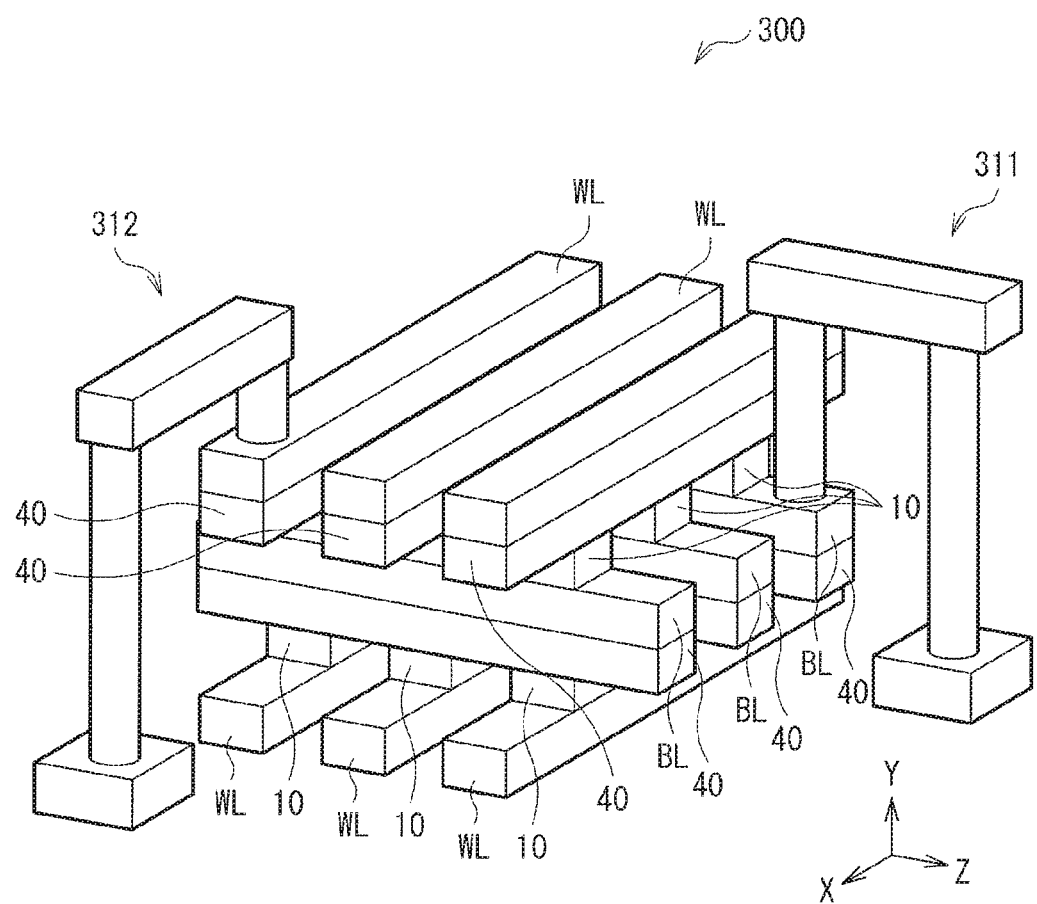

[ FIG. 21 ]
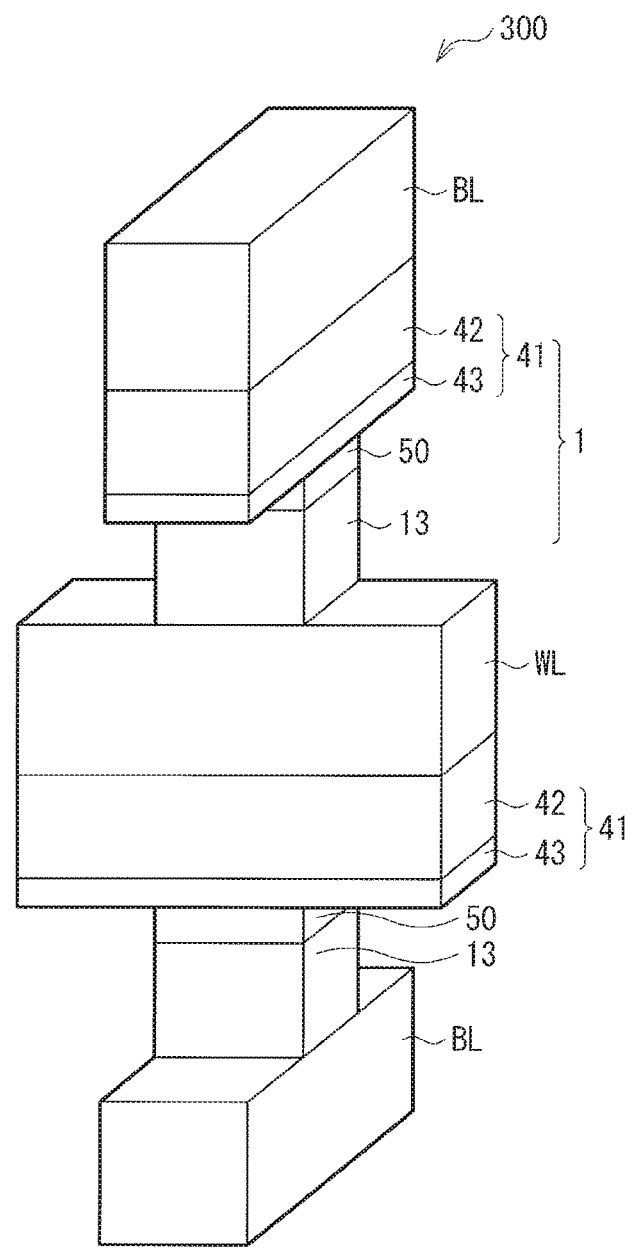

SELECTION DEVICE AND STORAGE APPARATUS

CROSS REFERENCE TO RELATED APPLICATIONS

This application is a U.S. National Phase of International Patent Application No. PCT/JP2018/014717 filed on Apr. 6, 2018, which claims priority benefit of Japanese Patent Application No. JP 2017-091113 filed in the Japan Patent Office on May 1, 2017. Each of the above-referenced applications is hereby incorporated herein by reference in its entirety.

TECHNICAL FIELD

The present disclosure relates to a selection device that includes a semiconductor layer including a chalcogenide between electrodes and a storage apparatus including the same.

BACKGROUND ART

In recent years, there has been a demand for an increase in capacities of nonvolatile memories for data storage represented by resistance-change memories such as ReRAMs (Resistance Random Access Memories). In contrast, a typical storage apparatus adopts a cross-point memory cell array structure in which a plurality of memory cells is arranged on a plane, or a stacked memory cell array structure in which a plurality of memory cells are stacked in a direction perpendicular to a plane, thereby achieving an increase in capacity.

The memory cells each generally includes two devices, that is, a storage device and a selection device. In the resistance-change memories such as ReRAMs, writing, reading, or erasing of information is performed by changing electrical characteristics (resistance states) of storage devices. The selection devices each selectively perform a writing operation or a reading operation on a storage device coupled to a specific bit line and a specific word line, and is coupled in series to the storage device. In the resistance-change memories, it is necessary to pass a relatively large current in order to change the resistance states of the storage devices, but magnitude of the current becomes a cause of a decrease in reliability of storage apparatuses. This is because most of a current flowing in the selection devices is converted into heat, thereby deteriorating cycle characteristics of the selection devices.

In contrast, for example, PTL 1 discloses a nonvolatile storage apparatus including interlayer films provided between memory cells disposed at respective intersections of two types of wiring lines (first metal wiring lines and third metal wiring lines) that intersect each other. In this nonvolatile storage apparatus, storage devices include a phase change material and selection devices include polysilicon. The interlayer films provided between adjacent memory cells differ between interlayer films provided between the storage devices and interlayer films provided between the selection devices, and interlayer films having thermal conductivity lower than that of the interlayer films provided between the selection devices are provided between the storage devices, which achieves a memory cell structure in which temperatures of the selection devices are less likely to become high.

CITATION LIST

Patent Literature

PTL 1: Japanese Unexamined Patent Application Publication No. 2010-040820

SUMMARY OF THE INVENTION

As described above, in a storage apparatus including a plurality of memory cells, an improvement in reliability is desired.

It is desirable to provide a selection device that makes it possible to improve reliability, and a storage apparatus including the same.

A selection device according to an embodiment of the present disclosure includes: a second electrode opposed to the first electrode; a semiconductor layer provided between the first electrode and the second electrode, and including at least one kind of chalcogen element selected from tellurium (Te), selenium (Se), and sulfur (S), and at least one kind of first element selected from boron (B), aluminum (Al), gallium (Ga), phosphorus (P), arsenic (As), carbon (C), germanium (Ge), and silicon (Si); and a first heat bypass layer provided at least in a portion around the semiconductor layer between the first electrode and the second electrode and having higher thermal conductivity than the semiconductor layer.

A storage apparatus according to an embodiment of the present disclosure includes a plurality of memory cells, and each of the memory cells includes a storage device and the selection device according to the embodiment of the present disclosure described above coupled to the storage device.

In the selection device according to the embodiment of the present disclosure and the storage apparatus according to the embodiment of the present disclosure, the first heat bypass layer having higher thermal conductivity than the semiconductor layer is provided at least in a portion around the semiconductor layer provided between the first electrode and the second electrode. This mitigates heat generation of the semiconductor layer in an on state.

According to the selection device according to the embodiment of the present disclosure and the storage apparatus according to the embodiment of the present disclosure, the first heat bypass layer having higher thermal conductivity than the semiconductor layer is provided at least in a portion around the semiconductor layer; therefore, heat generation of the semiconductor layer in the on state is mitigated, a safe operating range is expanded, and variations in operating condition are reduced. This makes it possible to improve reliability of the selection device and the storage apparatus including the selection device.

It is to be noted that effects described here are not necessarily limitative, and may be any of effects described in the present disclosure.

BRIEF DESCRIPTION OF THE DRAWINGS

FIG. 1 is a schematic cross-sectional view of a configuration of a selection device according to a first embodiment of the present disclosure.

FIG. 2 is a perspective view of configurations of an OTS layer and a heat bypass layer of the selection device illustrated in FIG. 1.

FIG. 3 is a schematic cross-sectional view of a configuration in which a plurality of selection devices illustrated in FIG. 1 are arranged.

FIG. 4 is a schematic view of an example of a schematic configuration of the memory cell array of the present disclosure.

FIG. 5 is an electrical schematic diagram of the memory cell array illustrated in FIG. 4.

FIG. 6 is a schematic view of a configuration of a memory cell illustrated in FIG. 4.

FIG. 7 is a measurement circuit diagram that evaluates electrical characteristics of a selection device.

FIG. 8 is a characteristic diagram of a typical selection device.

FIG. 9 is a characteristic diagram illustrating dependency of a resistance value of a selection device on a cross-sectional area of an electrode in an off state prior to forming.

FIG. 10 is a characteristic diagram illustrating the dependency of the resistance value of the selection device on the cross-sectional area of the electrode in the off state after forming.

FIG. 11 is a characteristic diagram illustrating a temperature distribution inside a filament.

FIG. 12 is a characteristic diagram of a current density distribution inside the filament.

FIG. 13 is a diagram illustrating current-voltage characteristics of the typical selection device.

FIG. 14 is a diagram illustrating current-voltage characteristics of the selection device illustrated in FIG. 1.

FIG. 15 is a characteristic diagram illustrating internal electrical resistance of the selection device illustrated in FIG. 1.

FIG. 16 is a schematic cross-sectional view of a configuration of a selection device according to a second embodiment of the present disclosure.

FIG. 17 is a perspective view of configurations of an OTS layer and a heat bypass layer of a selection device according to a third embodiment of the present disclosure.

FIG. 18 is a schematic cross-sectional view of a configuration of a selection device according to a first modification example of the present disclosure.

FIG. 19 is a schematic view of another example of a schematic configuration of a memory cell array according to a second modification example of the present disclosure.

FIG. 20 is a schematic view of another example of a schematic configuration of a memory cell array according to a third modification example of the present disclosure.

FIG. 21 is a detailed schematic cross-sectional view of a memory cell array illustrated in FIG. 20 at one cross-point.

MODES FOR CARRYING OUT THE INVENTION

Some embodiments of the present disclosure will be described below in detail with reference to the drawings. The following description is given of specific examples of the present disclosure, and the present disclosure is not limited to the following embodiments. In addition, the present disclosure is not limited to positions, dimensions, dimension ratios, etc. of respective components illustrated in the respective drawings. It is to be noted that description is given in the following order.

1. First Embodiment (an example a heat bypass layer is provided around an OTS layer)
  1-1. Configuration of Selection Device
  1-2. Configuration of Memory Cell Array
  1-3. Workings and Effects
2. Second Embodiment (an example in which a heat bypass layer is extended around an upper electrode and a lower electrode)
3. Third Embodiment (an example in which a heat bypass layer is provided on both sides of a semiconductor layer extending in one direction)
4. Modification Examples (other examples of a selection device and a memory cell array)

1. First Embodiment

FIG. 1 schematically illustrates a cross-sectional configuration of a selection device (a selection device 10) according to a first embodiment of the present disclosure. The selection device 10 selectively brings into operation an optional storage device (a storage device 40) of a plurality of storage devices arranged in a memory cell array (a memory cell array 100) having a so-called cross-point array structure illustrated in FIG. 4, for example. The selection device 10 is coupled in series to the storage devices 40, and has a configuration in which an OTS (Ovonic Threshold Switching) layer 13 (a semiconductor layer) is disposed between a lower electrode 11 (a first electrode) and a upper electrode 12 (a second electrode) that are opposed to each other, as will be described in detail later. In the selection device 10 according to the present embodiment, as illustrated in FIG. 2, a heat bypass layer 14 (a first heat bypass layer) is disposed around the OTS layer 13.

(1-1. Configuration of Selection Device)

The selection device 10 has resistance that greatly decreases (a low resistance state; an on state) with an increase in an applied voltage, and exhibits a high resistance state (an off state) in a case where the applied voltage is low. In other words, the selection device 10 has nonlinear electrical resistance characteristics in which electrical resistance is high in a case where the applied voltage is low, and electrical resistance greatly decreases in a case where the applied voltage is high and a large current (e.g., a current that is several orders of magnitude larger) flows. In addition, the selection device 10 returns to the high resistance state in a case where the applied voltage decreases to below a predetermined voltage (a threshold voltage) or in a case where application of the voltage is stopped, and does not maintain the on state (the low resistance state). The selection device 10 corresponds to a specific example of a "selection device" of the present disclosure.

The lower electrode 11 includes a wiring material used for a semiconductor process, such as tungsten (W), tungsten nitride (WN), titanium nitride (TiN), copper (Cu), aluminum (Al), molybdenum (Mo), tantalum (Ta), tantalum nitride (TaN), and silicide. In a case where the lower electrode 11 includes a material, such as Cu, that possibly causes ionic conduction by an electric field, a surface of the lower electrode 11 may be covered with a material, such as W, WN, TiN, and TaN, that is less likely to cause ionic conduction and difficult to conduct ions or thermal diffusion.

It is possible for the upper electrode 12 to use a known semiconductor wiring material similarly to the lower electrode 11, but the upper electrode 12 preferably uses a stable material that does not react with the OTS layer 13 even after post-annealing.

The OTS layer 13 serves as a current path in a case where a voltage is applied to the selection device 10 (e.g., in a case where a voltage pulse is applied to both ends of the device or in a case where a current pulse flowing through the selection device 10 is applied), and internal electrical resistance of the OTS layer 13 reversibly changes by temperature. The OTS layer 13 includes, for example, a material (a nonlinear resistance material) in which a current (I) exponentially increases as a voltage (V) increases.

In the present embodiment, the OTS layer 13 includes at least one kind of chalcogen element selected from Group 16 elements in the periodic table, specifically, tellurium (Te), selenium (Se), and sulfur (S). The OTS layer 13 includes at least one kind of first element selected from boron (B), aluminum (Al), gallium (Ga), phosphorus (P), arsenic (As), carbon (C), germanium (Ge), and silicon (Si), in addition to the chalcogen element described above. In addition, the OTS layer 13 may further include at least one kind of second element selected from oxygen (O) and nitrogen (N).

The OTS layer 13 preferably includes the chalcogen element, the first element, and the second element in the following ranges, for example. The chalcogen element is preferably included in a range from 10 atomic % to 70 atomic % both inclusive. The first element is preferably included in a range from 5 atomic % to 50 atomic % both inclusive. The second element is preferably included in a range from 1 atomic % to 40 atomic % both inclusive.

Note that the OTS layer 13 may include an element other than these elements without impairing effects of the present disclosure.

The heat bypass layer 14 has higher thermal conductivity than the OTS layer 13, and serves as a heat flow path between the lower electrode 11 and the upper electrode 12 for heat generated in a case where a voltage is applied to the selection device 10. The heat bypass layer 14 is provided around the OTS layer 13, for example, as illustrated in FIG. 2. The heat bypass layer 14 is preferably sufficiently larger in the internal electrical resistance than the OTS layer 13, and desirably has a band gap of 2 eV or more, for example. This makes it possible to prevent the heat bypass layer 14 from serving a current path.

The heat bypass layer 14 preferably includes an alloy including any of silicon oxide ($SiO_2$) doped with carbon (C), boron (B) or phosphorus (P), silicon nitride ($Si_3N_4$), aluminum oxide ($Al_2O_3$), cerium oxide ($CeO_2$), zircon oxide ($ZrO_2$), silicon carbide (SiC), beryllium oxide (BeO), zinc oxide (ZnO), titanium oxide ($TiO_2$), boron arsenide (BAs), antimony boride (BSb), boron phosphide (BP), and boron nitride (BN). Table 1 summarizes thermal conductivity of typical materials. The heat bypass layer 14 is preferably formed using these materials.

TABLE 1

| Compound Name | Thermal Conductivity (W/cmK) |
| --- | --- |
| Silicon Oxide Film ($SiO_2$) | 0.01 |
| Silicon Nitride ($Si_3N_4$) | <0.03 |
| Aluminum Oxide Film ($Al_2O_3$) | 0.11 |
| Zircon Oxide ($ZrO_2$) | 0.022 |
| Titanium Oxide ($TiO_2$) | 0.029 |
| Cerium Oxide ($CeO_2$) | 0.029 |
| Silicon Carbide (SiC) | <3 |
| Amorphous Silicon (a-Si) | 0.01 |
| Amorphous Germanium (a-Ge) | 0.05 |
| Carbon Boride ($B_4C$) | <0.02 |
| Germanium-Antimony-Tellurium ($Ge_2Sb_2Te_5$) | 0.02 |
| Beryllium Oxide (BeO) | 3.0 |
| Zinc Oxide (ZnO) | 0.5 |
| Boron Arsenide (BAs) | <20 |
| Antimony Boride (BSb) | <10 |
| Boron Phosphide (BP) | 4.0 |
| Boron Nitride (BN) | <2.0 |

The internal electrical resistance ($R_s$) of the selection device 10 is represented, for example, by the following equation (1). It is to be noted that a cross-sectional area refers to an area in a planar direction orthogonal to a stacking direction, and the same applies to a cross-sectional area to be described below. In addition, to be precise, the internal electrical resistance ($R_s$) of the selection device 10 is accurately a parallel combined resistance of the OTS layer 13 and the heat bypass layer 14, but in the present embodiment, a current does not flow through the heat bypass layer 14, which makes it possible to regard the internal electrical resistance ($R_s$) of the selection device 10 as internal electrical lowness of the OTS layer 13.

[Math. 1]

$$R_s = \frac{d}{\sigma_{OTS} S_{OTS}} \quad (1)$$

($R_s$: internal electrical resistance (Ω), $\sigma_{OTS}$: electrical conductivity of OTS layer (S/m), $\kappa_{OTS}$: thermal conductivity (W/(mK)), $S_{OTS}$: cross-sectional area (cm²), d: film thickness of OTS layer (cm))

The electrical resistance of the entire selection device 10 includes Schottky contact resistance and the like at an interface between an electrode (the lower electrode 11 or the upper electrode 12) and the OTS layer 13, in addition to the internal electrical resistance ($R_s$) represented by an equation other than the above-described equation (1). A current (I) flowing through the selection device 10 that is defined by considering the Schottky contact resistance and the above-described internal electrical resistance is represented b, for example, the following equation (2).

[Math. 2]

$$I = S_{OTS} A_{th}^* T^2 \exp\left(-\frac{e\phi_B}{k_B T}\right)\left[\exp\left(\frac{V_{sel} - R_s I}{n V_t}\right) - 1\right] \quad (2)$$

(I: current (A), Richardson constant: $A^*_{th}$ (A/cm²K²), Schottky barrier height: $\phi_B$ (eV), elementary charge: e (C), Boltzmann constant: $k_B$ (J/K), ideal factor: n, thermal voltage: $V_t$ ($=k_B T/e$) (V))

In the selection device 10 according to the present embodiment, in order to concentrate, on the heat bypass layer 14, a heat flow flowing in a direction toward the lower electrode 11 or a direction toward the upper electrode 12, the heat bypass layer 14 desirably satisfies the following equation (3).

[Math. 3]

$$\kappa_{bypass} S_{bypass} > \kappa_{OTS} S_{OTS} \quad (3)$$

($\kappa_{bypass}$: thermal conductivity of heat bypass layer (W/(mK)), $S_{bypass}$: cross-sectional area of heat bypass layer (cm²), $\kappa_{ors}$: thermal conductivity (W/(mK)), $S_{ors}$: cross-sectional area (cm²))

That is, the product of the thermal conductivity ($K_{bypass}$) and the cross-sectional area ($S_{bypass}$) of the heat bypass layer 14 is desirably larger than the product of the thermal conductivity ($K_{ots}$) and the cross-sectional area ($S_{ots}$) of the OTS layer 13. It is to be noted that, ideally, it is desirable that all of the heat flow passes through the heat bypass layer 14, and it is possible to approximate the thermal resistance ($R_h$) of the heat bypass layer 14 by the following equation (4).

[Math. 4]

$$R_h = \frac{d}{\kappa_{bypass} S_{bypass}} \quad (4)$$

In a case where a plurality of selection devices 10 is used side by side as in the memory cell array 100 to be described later, it is preferable to provide an electrothermal insulating layer 15 between adjacent selection devices 10 as illustrated in FIG. 3. The electrothermal insulating layer 15 has lower thermal conductivity than the heat bypass layer 14. Providing the electrothermal insulating layer 15 having low thermal conductivity between adjacent selection devices 10 makes it possible to prevent thermal interference between adjacent selection devices 10. Examples of a material of the electrothermal insulating layer 15 include silicon oxide ($SiO_2$), silicon nitride ($Si_3N$) and alloys thereof. Alternatively, a material included in the OTS layer 13 may be used.

(1-2. Configuration of Memory Cell Array)

FIG. 4 is a perspective view of an example of a configuration of the memory cell array 100. The memory cell array 100 corresponds to a specific example of a "storage apparatus" of the present disclosure. The memory cell array 100 is a storage apparatus having a so-called cross-point array structure, in which memory cells 1 are arranged at respective intersections of a plurality of word lines WL extending in one direction (e.g., an X-axis direction) and a plurality of bit lines BL extending in another direction (e.g., a Z-axis direction).

FIG. 5 illustrates an example of electrical coupling of the memory cell array 100. That is, the memory cell array 100 includes memory cells M11, M12, M13, M14, M21, M22, M23, M24, M31, M32, M33, M34, M41, M42, M43, and M44, one of which is disposed at a corresponding one of positions (cross-points) where respective word lines WL1 to WL4 and respective bit lines BL1 to BL4 are opposed to each other.

The memory cells 1 (M11, M12, M13, M14, M21, M22, M23, M24, M31, M32, M33, M34, M41, M42, M43, and M44) each include the selection device 10 and the storage device 40 that are coupled in series to each other, for example, as illustrated in FIG. 6, and have one end (e.g., on side of the selection device 10) electrically coupled to the bit line BL and the other end (e.g., on side of the storage device 40) electrically coupled to the word line WL. In other words, in the memory cell array 100, the storage device 40 is disposed closer to the word line WL, and the selection device 10 is disposed closer to the bit line BL.

It is to be noted that in the selection device 10 and the storage device 40, for example, as in a memory cell array 200 illustrated in FIG. 16, the selection device 10 may be disposed closer to the word line WL, and the storage device 40 may be disposed closer to the bit line BL. In addition, in a memory cell array in which, in a certain layer, the storage device 40 is disposed closer to the bit line BL and the selection device 10 is disposed closer to the word line WL, in a layer adjacent to the certain layer, the storage device 40 may be disposed closer to the word line WL and the selection device 10 may be disposed closer to the bit line BL. Further, in each layer, the storage device 40 may be formed on the selection device 10, or conversely, the selection device 10 may be formed on the storage device 40.

As described above, the respective word lines WL (WL1 to WL4) extend in a direction common to each other (in the X-axis direction in FIG. 4). The respective bit lines BL (BL1 to BL4) extend in a direction that is different from the extending direction of the word lines WL (e.g., in a direction perpendicular to the extending direction of the word lines WL) and is common to each other (in the Z-axis direction in FIG. 4), as described above. It is to be noted that the plurality of word lines WL and the plurality of bit lines BL may be disposed in a plurality of layers, and may be disposed separately in a plurality of layers, for example, as illustrated in FIGS. 17 and 18.

Each of the word lines WL and each of the bit lines BL are provided, for example, on a substrate (not illustrated). The substrate is provided with, for example, a wiring line group electrically coupled to each of the word lines WL and each of the bit lines BL, a circuit for coupling the wiring line group and an external circuit to each other, and the like.

The storage device 40 includes, for example, a pair of electrodes opposed to each other and a storage layer provided between the pair of electrodes. The storage device has a resistance value that is greatly changed by applying a voltage to the storage device 40 (e.g., applying a voltage pulse to both ends of the device or applying a current pulse passing through the storage device 40). The storage device 40 is one kind of so-called nonvolatile memory, and change in the resistance value is maintained even after the applied voltage is eliminated. The storage device 40 corresponds to a specific example of a "storage device" of the present disclosure.

Generally, a state in which a resistance value of a storage device is high is referred to as a "reset state" or an "off state", and a state in which the resistance value of the storage device is low is referred to as a "set state" or an "on state". Change from a high resistance state to a low resistance state is referred to as "set", change from the low resistance state to the high resistance state is referred to as "reset", and initial set is specifically referred to as "forming". The forming is an electrical operation means that determines a current path ins a case where initial and subsequent voltage pulses or initial and subsequent current pulses are applied, and is formed autonomously. Forming is also executed in the selection device 10. An autonomously formed current path is commonly referred to as "filament". One storage device 40 is able to store at least one bit of data by making the off state correspond to a theoretical value "0" and the on state to a theoretical value "1".

It is to be noted that in addition to the resistance-change memory device described above, the storage device 40 can take any of memory forms including, for example, as an OTP (One Time Programmable) storage device that is rewritable only once using a fuse or an anti-fuse, a unipolar phase change storage device (PCRAM), a magnetoresistive storage device, and the like.

In the memory cell array 100, each of a pair of electrodes (one electrode and another electrode) of the storage device 40 and a pair of electrodes (the lower electrode 11 and the upper electrode 12) of the selection device 10 may be provided separately from word lines WL and bit lines BL, or the word lines WL and bit lines BL may also serve as the electrodes. That is, the memory cell 1 in the memory cell array 100 illustrated in FIG. 4 may have a configuration in which the one electrode, the storage layer, the other electrode, the lower electrode 11, the OTS layer 13 (and the heat bypass layer 14), and the upper electrode 12 are stacked from side of the word lines WL toward side of the bit lines BL, or may have a structure in which the storage layer and the OTS layer 13 (and the heat bypass layer 14) are directly stacked. It is to be noted that in a case where the memory cells 1 each include the storage layer and the OTS layer 13

(and the heat bypass layer 14), it is preferable to provide an intermediate electrode 50 between the selection device 10 and the storage device 40 as in the memory cell array 200 illustrated in FIG. 16.

(1-3. Workings and Effects)

A unit device that stores data in a semiconductor memory is referred to as a memory cell. In a typical storage apparatus, a plurality of such memory cells is arranged on a plane (a cross-point memory cell array) or is stacked vertically with respect to the plane (a stacked memory cell array), thereby achieving an increase in capacity. In either case, each of the plurality of memory cells included in the memory cell array is located at a corresponding one of intersections of two conductors called word lines and bit lines, and the respective positions are specified by applying appropriate signals to a corresponding one of the word lines and a corresponding one of the bit lines. The memory cells each generally include two devices, that is, a storage device and a selection device. For example, in a NAND-Flash memory, the storage device includes a floating gate, and the selection device includes a field-effect transistor. In a resistance-change memory (Resistive RAM: ReRAM), the storage device includes a high-resistance film, and the selection device includes, for example, an MSM (Metal-Semiconductor-Metal) diode or an MIM (Metal-Insulator-Metal) diode.

Incidentally, in storage apparatuses, high reliability is desired in addition to an increase in capacity. In order to insure reliability of the storage apparatuses for a long period of time, it is essential that a cumulative energization time that the selection device included in the memory cell is able to withstand exceeds a cumulative energization time of the storage device for the above-described reason.

For example, as illustrated in FIG. 7, it is possible to evaluate electrical characteristics of the selection device by a circuit that directly couples a selection device (a selection device 1100) and a field effect transistor (a field effect transistor 1200) to each other. The magnitude and period of the power supply voltage Vin applied to the circuit illustrated in FIG. 7 are controlled by an externally coupled DC or AC signal source automatic sweeping apparatus. A current value I is monitored by a multimeter or an accessory function of the signal source automatic sweeping apparatus.

A maximum current ($I_{comp}$) flowing through the selection device 1100 is controlled by a gate voltage (Vg) of the field-effect transistor 1200. If characteristics of the field-effect transistor 1200 are measured in advance, a voltage ($V_{ds}$) between a drain electrode and a source electrode in a case where the current (I) flows is known, which makes it possible to estimate an device voltage ($V_{sel}$) of the selection device 1100 with sue of the following equation (5).

[Math. 5]

$$V_{sel} = V_{in} - V_{ds} \quad (5)$$

Herein, Vth represents a threshold voltage at which the selection device 1100 changes from the off state to the on state, and Ith represents a threshold current. In order to change a state of a nonvolatile storage device, it is necessary to flow a certain current or more, and a symbol of the current is equivalent to the maximum current ($I_{comp}$).

In a cross-point memory cell array, an area occupied by one memory cell is limited. For this reason, an approximate value of current density obtained by dividing the maximum current ($I_{comp}$) by an electrode area often exceeds an allowable value of a standard semiconductor such as silicon (Si) and germanium (Ge). Therefore, in a selection device such as an MSM diode and an MIM diode (hereinafter, referred to as a selection diode device), a semiconductor film and an insulating film each often include a so-called OTS material including at least one kind of chalcogen element selected from sulfur (S), selenium (Se), and tellurium (Te). FIG. 8 illustrates current-voltage characteristics of a selection diode device having a semiconductor film or insulating film formed using the OTS material (hereinafter referred to as an OTS film). The selection diode device having the OTS film exhibits a negative differential resistance property as illustrated in FIG. 8. A boundary voltage value at which a sign of differential resistance changes from positive to negative is the threshold voltage Vth, and a current value thereof is the threshold current Ith. The negative differential resistance property is a property specific to the OTS film exhibiting phase change, and is also interpreted as a property of an operation (filamentation) in which a flow path (current path) of a current passing through the OTS film is narrowed.

Although it is difficult to accurately demonstrate the operation in which the current path is narrowed, the threshold voltage and a leakage current after forming are often characteristically changed from the threshold voltage and the leakage current before the forming. It is to be noted that the leakage current is a current equal to or less than a threshold value of a current that flows in a case where the selection diode device is in the off state. In general, in the selection diode device having the OTS film, it is considered that most of a region of the OTS film immediately after film formation is occupied by an amorphous phase. The region occupied by the amorphous phase is superior in nonlinearity and an electrical insulating property. Accordingly, in a state before forming, the leakage current flowing through the selection diode device is extremely small.

In contrast, in the selection diode device after forming, generally, the leakage current increases and the threshold voltage decreases. This is considered because a portion of the amorphous phase included in the OTS film is crystallized during the forming to form a region having high electrical conductivity (a filament). The filament serves as a flow path of a current flowing through the OTS film, and also serves as a main flow path (a heat flow path) of a heat flow flowing in a thickness direction of the OTS film.

FIGS. 9 and 10 illustrate results of measuring resistance in the off state of the selection device 1100 before forming (FIG. 9) and after forming (FIG. 10) in the circuit illustrated in FIG. 7. It is to be noted that off resistance before forming is measured at $V_{sel}$=4 V, and off resistance after forming is measured at $V_{sel}$=3 V. A vertical axis of each of the characteristic diagrams illustrated in FIGS. 9 and 10 indicates the reciprocal 1/Splug of a cross-sectional area (Splug) of the cathode electrode, and the smaller the cross-sectional area (Splug) of the cathode electrode moves toward the left with decreasing the cross-sectional area (Splug) and moves toward the right with increasing the cross-sectional area (Splug). Electrical resistance is inversely proportional to the cross-sectional area of the current path. In FIG. 9, resistance values in the off state before forming are plotted on a straight line in a upward right direction; therefore, the result in FIG. 9 indicates that the cross-sectional area (Splug) of the cathode electrode is proportional to the cross-sectional area of the current path. This means that the leakage current flows relatively uniformly over the cathode electrode. In contrast, in FIG. 10, resistance in the off state after forming is not always proportional to the cross-sectional area (Splug) of the cathode electrode. This means that a filament (a current path) having a certain cross-sectional area is formed in the amorphous phase by the forming, and is an evidence that the operation in which the current path is narrowed (filamentation) occurs. The leakage current flows non-uniformly in the amorphous phase, specifically, the leakage current is concentrated in the filament; therefore, a correlation between the resistance value in the off state and the cross-sectional area (Splug) of the cathode electrode is decreased.

In a storage device having non-volatility such as a ReRAM, it is possible to easily observe a filament formed by forming. This is because an irreversible change in crystal structure inside the storage device is involved, thereby causing a trace of the filament to remain in a portion of a ReRAM material included in the storage layer, which makes it possible to confirm the filament by, for example, a SEM image or X-ray absorption spectroscopy. In contrast, it is difficult to directly observe a filament formed in the selection diode device even by using an SEM image, X-ray absorption spectroscopy, an electron microscope, or the like, and presence of the filament is only indirectly verified as illustrated in FIGS. 9 and 10 described above. This is because the selection diode is formed using a phase change material having volatility, such as an OTS material. In the selection diode, a change in crystal structure caused by forming is not permanent and the change in crystal structure is considered to gradually recover from an easily observable crystal structure having a low electrical insulating property to not a fully amorphous state but a crystal structure having a high electrical insulating property that is difficult to observe.

Incidentally, according to the Boeer theory in which a relationship between negative differential resistance and a filament is clarified by a mathematical method, it can be understood from current-voltage characteristics illustrated in FIG. 8 that local increases in temperature and current density are causes of formation of the negative differential resistance and the filament. FIGS. 11 and 12 illustrate a temperature distribution (FIG. 11) and a current density distribution (FIG. 12) inside the selection diode device calculated on the basis of the Boeer theory Joule originated from Joule heat, where s is normalized power, r/R is a normalized radial coordinate, $(T-T_R)/\Theta$ is normalized temperature, and $j/j_n$ is the normalized current density. As described above, the filament serve as a current path that flows through the inside of the selection diode device in a film thickness direction of the OTS film, and serve as a heat flow path. Thus, a cross-sectional area of the filament is a cross-sectional area of the current path and a cross-sectional area of the heat flow path, and it is possible to approximate each of the cross-sectional areas by a $\pi r_{HWHM}^2$, where $r_{HWHM}$ is a half width at half maximum of each of the distributions. It can be seen from FIGS. 11 and 12 that as electric power inputted to the selection diode device increases, the temperature and the current density of a central portion of the selection diode device increase toward infinity. This phenomenon is commonly known as "thermal breakdown" and is a phenomenon that inevitably occurs in materials such as semiconductors and insulators in which electrical conductivity increases exponentially with respect to temperature. In the selection diode device, a material of which a crystal structure performs a reversible phase change to some extent is used to achieve relatively long-term tolerance to deterioration in cycle characteristics even if the inside of the selection diode device is at an ultrahigh temperature. Therefore, in the selection diode device, a chalcogen element such as sulfur (S), selenium (Se), or tellurium (Te) is used instead of a standard crystal semiconductor such as silicon (Si) or germanium (Ge).

FIG. 13 illustrates current-voltage characteristics of a typical selection diode device having an OTS film in an amorphous state between a pair of electrodes opposed to each other. FIG. 13 additionally illustrates four curves each indicating a temperature inside the selection diode device estimated from the product of a current and a voltage that indicates negative differential resistance. The four curves correspond to isothermal curves in a case where the highest temperature (T(r=0)) of the selection diode device is 100° C., 200° C., 400° C. and 1000° C. Generally, a temperature of around 400° C. is considered to be an upper limit of a practical safe operating range of the OTS material. An essential reason why cycle deterioration of a selection device diode occurs is considered to be that thermal conductivity of the OTS material is small, and as can be seen from the Boeer theory, an increased temperature in a Joule-heating region easily increases a crystallization temperature and a melting temperature of the OTS material.

As described above, in order to insure reliability of the storage apparatus for a long period of time, it is necessary for a cumulative energization time that the selection diode device is able to withstand to exceed a cumulative energization time of the storage device, which however proves difficult to achieve in view of Joule heating. In addition, a maximum current used in a nonvolatile storage device is out of a safe operating range of the selection device diode, which is not a cause of rate-limiting to long-term reliability of the storage apparatus. Further, in the configuration of the typical selection diode device described above, it is difficult to control a shape of the filament, and variations in threshold voltage and threshold current between a plurality of selection diode devices are increased. This limits an array size of the memory cell array.

In contrast, in the selection device 10 according to the present embodiment, the heat bypass layer 14 having higher thermal conductivity than that of the OTS layer 13 is provided around the OTS layer 13 between the lower electrode 11 and the upper electrode 12 that are opposed to each other.

FIG. 14 illustrates current-voltage characteristics of an example formed using the following method as an example of the selection device 10 according to the present embodiment.

Examples

First, a cathode electrode (the lower electrode 11) including an elemental composition of TiN was cleaned by reverse sputtering. Next, the OTS layer 13 including B40C13Te17-N30 (atomic %) was formed on TiN with a thickness of, for example, 30 nm by reactive sputtering while flowing nitrogen into a film formation chamber. Subsequently, after the OTS layer 13 was side-etched to have a diameter of 60 nmϕ, the heat bypass layer 14 including BAs was formed around the OTS layer 13 to have an inner diameter of 60 nmϕ, an outer diameter of 100 nmϕ, and a thickness of 30 nm. Lastly, an anode (the upper electrode 12) including a W film was formed. A final device size was 100 nmϕ. It is to be noted that in this example, a thermal resistance value was adjusted not to cause a threshold current to greatly differ from a threshold current of the typical selection device (the selection diode device) used in a current-voltage characteristic diagram illustrated in FIG. 13.

FIG. 14 additionally illustrates four curves each indicating a temperature inside the selection device estimated from the product of a current and a voltage that indicates negative differential resistance, as in FIG. 13. The four curves correspond to isothermal curves in a case where the highest temperature (T(r=0)) of the selection device 10 is 100° C., 200° C., 400° C. and 1000° C. Thermal resistance $R_h$ of the heat bypass layer 14 provided around the OTS layer 13 has an influence on both the threshold voltage Vth and the threshold current Ith of the selection device.

As compared with the typical selection diode device illustrated in FIG. 13, the selection device 10 according to the present embodiment has a large ratio ($R_s/R_h$) of internal thermal resistance ($R_s$) to thermal resistance ($R_h$), which thus increases the threshold voltage. This is considered to be because thermal tolerance of a metal-semiconductor interface (an interface between both the lower electrode 11 and the upper electrode 12 and the OTS layer 13) was improved by shunting a heat flow to the heat bypass layer 14. Specifically, it is considered that a barrier height and an ideal factor that determined a value of Schottky contact resistance were able to withstand a high temperature during an operation of a selector, which made it possible to maintain these values before and after forming. As a result, although not illustrated here, variations in the threshold voltage Vth and the threshold current Ith were each reduced by 20% or more. That is, the thermal resistance $R_h$ was controlled to match the value of the internal electrical resistance $R_s$, which made it possible to greatly reduce the variations in the threshold voltage Vth and the threshold current Ith of the selection device 10.

In addition, in FIG. 14, the isothermal curves in cases of 100° C., 200° C., 400° C., and 1000° C. moved toward a larger current-voltage product. This indicates that providing the heat bypass layer 14 causes a decrease in the thermal resistance ($R_h$) of the selection device 10. That is, it can be seen that, in the selection device 10, heat generation in the OTS layer 13 in the on state was reduced by the OTS layer 13 becoming the current path and the heat bypass layer 14 becoming the heat flow path, and the practical safe operating range of the OTS layer 13 (e.g., a range occupied by the isothermal curve at 400° C.) was expanded. Further, the selection device 10 was able to have a margin of a maximum current of 100 µA or more while maintaining cycle characteristics of 10E7 or more cycles.

FIG. 15 illustrates the temperature characteristics of the internal electrical resistance $R_s$ in the selection device 10 after forming, and illustrates the internal electrical resistance $R_s$ of the selection device 10 obtained from the current-voltage characteristics illustrated in FIG. 14. The internal electrical resistance $R_s$ is expressed in an device temperature T. The OTS layer 13 according to the present embodiment undergoes phase transition at specific phase transition temperatures ($T_{t1}$ and $T_{t2}$ in FIG. 15) while keeping a solid phase. Here, a crystal phase that becomes stable at a temperature exceeding $T_{t1}$ is referred to as a high-temperature stable phase, and a crystal phase that becomes stable at a temperature of $T_{t2}$ or lower is referred to as a low-temperature stable phase. The phase transition between solid phases is a phenomenon that is different from solid-liquid phase transition (liquid-solid transformations) used by a phase change memory including germanium (Ge), antimony (Sb), and tellurium (Te), for example, and is referred to as polymorphic transition (polymorphic transformation). In the OTS layer 13, the internal electrical resistance is large in a case where the temperature is low (in the low-temperature stable phase or a normal-temperature stable phase), and the internal electrical resistance is small in a case where the temperature is high (in the normal-temperature stable phase or the high-temperature stable phase). A discontinuous point of the internal electrical resistance appears as a polymorphic transition temperature. In a case where the selection device 10 that includes the OTS layer 13 including boron (B) and carbon (C) as described above is driven, switching between the on state and the off state of the selection device 10 is determined by, for example, whether an operating temperature is equal to or higher than $T_{t2}$, or equal to or lower than $T_{t2}$.

Assuming that an electrode applied to the selection device 10 is I×Vsel (W), the operating temperature of the selection device 10 is approximately expressed by the following equation (6). In order to prevent the crystal structure of the selection device 10 from being destroyed, it is desirable, for example, to limit the operating temperature not to exceed a polymorph transition temperature $T_{t1}$.

[Math. 6]

$$T = T_a + R_h I V_{sel} \quad (6)$$

Qualitative expressions of the threshold voltage Vth and the threshold current Ith are approximated using the above equations (1) to (6), thereby being expressed by the following equations (7) and (8), respectively. It can be seen from the equation (7) that the threshold value Vth is proportional to the ratio of the internal electrical resistance ($R_s$) to the thermal resistance ($R_h$)($R_s/R_h$). In addition, it can be seen from the equation (8) that the threshold current Ith is inversely proportional to the thermal resistance ($R_h$). It is to be noted that the equations (7) and (8) include many omissions in a derivation process, and are therefore not mathematically exact expressions. Further, $\chi$ is a parameter representing an effect of thermionic emission, and is defined by the following equation (9).

[Math. 7]

$$V_{th} = n(\phi_B - \chi V_t) + \frac{R_s T}{(2+\chi)nV_t R_h} - \frac{n(\phi_B - V_t - \chi V_t)R_s T}{R_s T + (2+\chi)n^2(\phi_B - \chi V_t)V_t R_h} \quad (7)$$

$$I_{th} = \left[ n(\phi_B - \chi V_t) + \frac{R_s T}{(2+\chi)nV_t R_h} \right] \frac{T}{R_s T + (2+\chi)n^2(\phi_B - \chi V_t)^2 R_h} \quad (8)$$

$$\ln\left(\frac{I}{SA_{th}T^2}\right) = -\chi \quad (9)$$

Further, it can be seen that it is sufficient if $R_s/R_h$ is controlled to be a fixed value in order to reduce variations of the threshold voltage. In order to reduce variations of the threshold current, it is necessary to control the thermal resistance ($R_h$) to be a fixed value. The above-described equation (1) shows that the $R_s$ is inversely proportional to the cross-sectional area of the current path. In addition, the equation (4) shows that the value of the thermal resistance ($R_h$) is inversely proportional to the cross-sectional area of the heat flow path. In the selection device 10 according to the present embodiment, almost the entire OTS layer 13 serves as a current path. This is because forming causes an amorphous structure to be changed to a polymorphic crystal structure identified by the low-temperature stable phase or the normal-temperature stable phase, which causes the OTS layer 13 to operate as a permanent and stable filament. In addition, the entire heat bypass layer 14 serves as a heat flow path. That is, the cross-sectional area of the current path is determined by the inner diameter of the heat bypass layer, and the cross-sectional area of the heat flow path is determined by a difference between the outer diameter and the inner diameter of the heat bypass layer.

It is to be noted that it is also possible to confirm the characteristics illustrated in FIG. 15 in a typical selection diode device using boron (B) and carbon (C) as materials of the OTS layer. However, in the typical selection diode device, the characteristics of the selection diode device is deteriorated in a short time due to degradation of the OTS layer.

As described above, in the selection device 10 according to the present embodiment, the heat bypass layer 14 is provided around the OTS layer 13, which causes heat generated in the on state to selectively flow through the heat bypass layer 14, and causes a temperature rise in the OTS layer 13 to be reduced. As a result, the safe operating range of the selection device 10 is expanded, and variations in the threshold voltage Vth and the threshold current Ith are reduced. This makes it possible to improve reliability of the selection device 10 and the memory cell array 100 including the selection device 10.

In addition, in the present embodiment, in a case where a plurality of selection devices 10 is used as in the memory cell array 100 illustrated in FIG. 10, the electrothermal insulating layer 15 is provided between adjacent selection devices 10. This makes it possible to prevent thermal interference between the adjacent selection devices 10 and to further improve reliability of the memory cell array 100.

Next, second and third embodiments and modification examples of the present disclosure will be described. Hereinafter, components similar to those of the first embodiment are denoted by same reference numerals, and description thereof is omitted as appropriate.

2. Second Embodiment

FIG. 16 illustrates a cross-sectional configuration of a selection device (a selection device 20) according to the second embodiment of the present disclosure. As in the selection device 10 in the first embodiment described above, the selection device 20 selectively brings into operation an optional storage device (the storage device 40) of a plurality of storage devices arranged in a memory cell array (e.g., the memory cell array 100) having a cross-point array structure, for example. The selection device 20 is coupled in series to the storage device 40, and the OTS layer 13 is disposed between the lower electrode 11 and the upper electrode 12 that are opposed to each other. The present embodiment differs from the first embodiment in that a heat bypass layer 24 is continuously disposed around the lower electrode 11, the upper electrode 12, and the OTS layer 13.

As illustrated in FIG. 16, in the present embodiment, the heat bypass layer 24 provided around the OTS layer 13 extends to the lower electrode 11 and the upper electrode 12, thereby reducing thermal contact resistance between both the lower electrode 11 and the upper electrode 12, and the heat bypass layer 24. This makes it possible to further expand safe operating ranges of the selection device 20 and the memory cell array (e.g., the memory cell array 100) including the selection device 20.

3. Third Embodiment

FIG. 17 is a perspective view of an OTS layer 33 and a heat bypass layer 34 included in a selection device (a selection device 30) according to the third embodiment of the present disclosure. As in the selection device 10 in the first embodiment described above, the selection device 30 selectively brings into operation an optional storage device (a storage device 40) of a plurality of storage devices arranged in a memory cell array (e.g., the memory cell array 100) having a cross-point array structure, for example. The selection device 30 is coupled in series to the storage device 40, and the OTS layer 33 is disposed between the lower electrode 11 and the upper electrode 12 that are opposed to each other. The present embodiment differs from the first and second embodiments in that the OTS layer 33 extends in one direction (e.g., in a direction of the word line WL or a direction of the bit line BL) and the heat bypass layers 34 are provided on both sides of the extending OTS layer 33.

As illustrated in FIG. 17, in the present embodiment, the OTS layer 33 and the heat bypass layer 34 extend in, for example, the direction of the word line WL or the direction of the bit line BL. In this configuration, for example, in a case where the OTS layer 33 and the heat bypass layer 34 extend in the direction of the word line WL, effects of the heat bypass layer 34 in the direction of the bit line BL are limited, but a heat bypass layer suitable for a stacked memory cell array (a memory cell array 300, see FIG. 20) to be described later is achieved.

In the selection device 30 according to the present embodiment, it is possible to convert the equations (1), (3), and (4) described above into equivalent expressions (electrical resistance per unit length and thermal resistance per unit length) by substitution of widths $W_{OTS}$ and $W_{bypass}$ of the OTS layer 33 and the heat bypass layer 34 instead of the cross-sectional areas $S_{OTS}$ and $S_{bypass}$. In addition, in the present embodiment, the heat bypass layer 34 also serves as the electrothermal insulating layer 15 described above, which makes it possible to omit the electrothermal insulating layer 15. This makes it possible to reduce a cell size of a memory cell (e.g., a memory cell 4).

4. Modification Examples

Modification Example 1

FIG. 18 schematically illustrates a cross-sectional configuration of a selection device (a selection device 60) according to a modification example of the present disclosure. As in the selection device 10 in the first embodiment described above, the selection device 60 selectively brings into operation an optional storage device (the storage device 40) of a plurality of storage devices arranged in a memory cell array (e.g., the memory cell array 100) having a cross-point array structure, for example. As in the selection device 10, the selection device 60 according to the present modification example includes a heat bypass layer 64A around the OTS layer 13 provided between the lower electrode 11 and the upper electrode 12 that are opposed to each other, and includes a heat bypass layer 64B (a second heat bypass layer) inside (e.g., in a central portion of) the OTS layer 13.

Both the heat bypass layer 64A and the heat bypass layer 64B have characteristics similar to those of the heat bypass layer 14, and are preferably formed using the materials described in the first embodiment. In addition, the heat bypass layer 64A and the heat bypass layer 64B may be formed using the same material or may be formed using different materials.

As described above, the OTS layer 13 is formed in an annular shape and the heat bypass layer 64B is provided in a central portion of the annular shape, which makes it possible to achieve a more uniform temperature distribution inside the OTS layer 13. This makes it possible to further stabilize the size of the current path formed in the OTS layer 13.

The cross-sectional area ($S_{bypass}$) of the heat bypass layer in a case where the selection device 60 according to the present modification example corresponds to the equation (3) and the like described above is the sum of the heat bypass layer 64A provided around the OTS layer 13 and the heat bypass layer 64B provided in the central portion. In addition, a configuration of the present modification example is applicable not only to a cylindrical selection device but also to, for example, the selection device 30 described in the third embodiment in which the OTS layer 33 extends in one direction. Specifically, as in the heat bypass layer 64B in the present modification example, a heat bypass layer is formed in, for example, the central portion of the OTS layer to extend in the same direction as the OTS layer 33. Thus, effects are achievable similarly to the present modification example.

Modification Example 2

FIG. 19 is a perspective view of a configuration of a memory cell array 200 according to a modification example of the present disclosure. The memory cell array 200 is a cross-point memory cell array, as in the memory cell array 100. In the memory cell array 200 according to the present modification example, the selection device 10 extends along the respective word lines WL extending in a direction common to each other. The storage device 40 extends along the bit lines BL extending in a direction that is different from the extending direction of the word lines WL (e.g., in a direction perpendicular to the extending direction of the word lines WL). In addition, at each of cross-points of the plurality of word lines WL and the plurality of bit lines BL, the selection device 10 and the storage device 40 are stacked with the intermediate electrode 50 interposed therebetween.

As described above, in a case where the memory cell 1 includes a storage layer and the OTS layer 13 (and the heat bypass layer 14), it is preferable to provide the intermediate electrode 50 between the storage device 40 (the storage layer) and the selection device 10 (the OTS layer and the heat bypass layer 14) as in the present modification example.

As described above, in the case where the memory cell 1 includes the storage layer and the OTS layer 13 (and the heat bypass layer 14), the intermediate electrode 50 also serves as one of a pair of electrodes between which the storage layer is interposed and one electrode (here, the upper electrode 12) of the selection device 10. The intermediate electrode 50 preferably includes a material that prevents diffusion of chalcogen elements included in the OTS layer 13 and the storage layer by application of an electric field, for example. This is because, for example, the storage layer includes a transition metal element as an element for performing a memory operation and maintaining a writing state, but in a case where the transition metal element diffuses into the OTS layer 13 by application of an electric field, switch characteristics may be deteriorated. Therefore, the intermediate electrode 50 preferably includes a barrier material having a barrier property for preventing diffusion of the transition metal elements and ion conduction. Examples of the barrier material include tungsten (W), tungsten nitride (WN), titanium nitride (TiN), carbon (C), molybdenum (Mo), tantalum (Ta), tantalum nitride (TaN), titanium tungsten (TiW), and silicide.

As described above, the selection device 10 and the storage device 40 are not only provided at the cross-point, but also provided to respectively extend along the word line WL and the bit line BL, which makes it possible to form, for example, the OTS layer 13 or the storage layer simultaneously with a layer to become the bit line BL or the word line WL and collectively perform shape processing by a photo-lithography process. This make it possible to reduce the number of processes.

Modification Example 3

FIG. 20 is a perspective view of an example of a configuration of a memory cell array 300 having a three-dimensional structure according to a modification example of the present disclosure. FIG. 21 illustrates a detailed cross-sectional configuration along a Y-axis direction at one cross-point of the memory cell array 300. The respective word lines WL extend in a direction common to each other (in the X-axis direction in FIG. 20). The respective bit lines BL extend in a direction that is different from the extending direction of the word lines WL (e.g., in a direction perpendicular to the extending direction of the word line WL (in the Z-axis direction in FIG. 20)) and is common to each other. In the memory cell array 300 having the three-dimensional structure, the word lines WL and the bit lines BL are alternately stacked in the Y-axis direction (in order of the word line WL, the bit line BL, and the word line WL in FIG. 20), and the memory cells 1 are formed at respective positions between the word lines WL and the bit lines BL that are stacked. That is, the memory cell array 300 according to the present modification example is a cross-point memory cell array, and is a stacked memory cell in which a plurality of memory cells 1 is stacked in the Y-axis direction.

In the present modification example, the selection devices 10 are provided along the word lines WL and the bit lines BL above the respective word lines WL and the respective bit lines BL. The storage devices 40 are provided along the word lines WL and the bit lines BL below the respective word lines WL and the respective bit lines BL. As a result, the selection device 10 and the storage device 40 are stacked at a cross-point of the word line WL and the bit line BL to form the memory cell 1. In the present modification example, each of intermediate electrodes 50 provided between the word line WL and the storage device 40, between the bit line BL and the storage device 40, and between the selection device 10 and the storage device 40 also serve as a corresponding one of the lower electrode 11 and the upper electrode 12 of the selection device 10 and the pair of electrodes of the storage device 40. That is, the OTS layer 13 and the storage layer 41 are stacked at the cross-point of the word line WL and the bit line BL with the intermediate electrode 50 interposed therebetween. The storage layer 41 includes, for example, an ion source layer 42 and a variable resistance layer 43. The variable resistance layer 43 is disposed on side of the intermediate electrode 50.

The ion source layer 42 includes a movable element that forms a conduction path in the variable resistance layer 43 by application of an electric field. Examples of the movable element include transition metal elements (in Group 4 to Group 6 of the Periodic Table) and chalcogen elements, and the ion source layer 42 includes one kind or two or more kinds of these elements. In addition, the ion source layer 42 preferably includes oxygen (O), nitrogen (N), and an element other than the elements described above. Examples of the element other than the elements described above include Al, Cu, zirconium (Zr), and hafnium (Hf). In addition to the elements described above, the ion source layer 42 may include, for example, manganese (Mn), cobalt (Co), iron (Fe), nickel (Ni), platinum (Pt), Si, or the like.

The variable resistance layer 43 includes, for example, an oxide or nitride of a metal element or a non-metal element, and has a resistance value that changes in a case where a predetermined voltage is applied between a pair of electrodes of the storage device 40.

In the memory cell array 300, corresponding sockets (BL socket 311 and WL socket 312) are provided to respective layers of the word lines WL and bit lines BL that are stacked. The BL socket 311 and the WL socket 312 are coupled to a memory cell selection circuit and a read/write interface circuit (not illustrated) on, for example, an outer periphery of the memory cell array 300.

It is to be noted that the modification examples 2 and 3 describe an example in which the selection device 10 described in the first embodiment is used as the selection device, but the selection device 20, 30, or 60 described in the second and third embodiments or the modification example 1 may be used.

Although the present disclosure has been described with reference to the first to third embodiments and the modification examples, the content of the present disclosure is not limited to the embodiments and the like described above, and may be modified in a variety of ways. It is to be noted that effects described in this specification are merely examples. Effects of the present disclosure are not limited to the effects described herein. The present disclosure may have effects other than the effects described herein.

It is to be noted that the present disclosure may have the following configurations.

(1)
A selection device including:
a first electrode;
a second electrode opposed to the first electrode;
a semiconductor layer provided between the first electrode and the second electrode, and including at least one kind of chalcogen element selected from tellurium (Te), selenium (Se), and sulfur (S), and at least one kind of first element selected from boron (B), aluminum (Al), gallium (Ga), phosphorus (P), arsenic (As), carbon (C), germanium (Ge), and silicon (Si); and
a first heat bypass layer provided at least in a portion around the semiconductor layer between the first electrode and the second electrode and having higher thermal conductivity than the semiconductor layer.

(2)
The selection device according to (1), in which the semiconductor layer further includes at least one kind of second element selected from oxygen (O) and nitrogen (N).

(3)
The selection device according to (1) or (2), in which the first heat bypass layer extends to side surfaces of the first electrode and the second electrode.

(4)
The selection device according to any one of (1) to (4), in which the first heat bypass layer includes an alloy including any of silicon oxide ($SiO_2$) or silicon nitride ($Si_3N$) doped with carbon (C), boron (B) or phosphorus (P), aluminum oxide ($Al_2O$), cerium oxide ($CeO_2$), zircon oxide ($ZrO_2$), silicon carbide (SiC), beryllium oxide (BeO), zinc oxide (ZnO), titanium oxide ($TiO_2$), boron arsenide (BAs), antimony boride (BSb), boron phosphide (BP), and boron nitride (BN).

(5)
The selection device according to any one or (1) to (4), in which a product of thermal conductivity and a cross-sectional area of the first heat bypass layer is greater than a product of thermal conductivity and a cross-sectional area of the semiconductor layer.

(6)
The selection device according to any one of (1) to (5), in which the semiconductor layer has an annular shape and a second heat bypass layer is provided in a central portion of the annular shape.

(7)
The selection device according to any one of (1) to (6), in which the semiconductor layer is changed to a low resistance state by setting an applied voltage to a predetermined threshold voltage or higher and is changed to a high resistance state by decreasing the applied voltage to below the predetermined threshold voltage without phase change between an amorphous phase and a crystal phase.

(8)
A storage apparatus provided with a plurality of memory cells, each of the plurality of memory cells including a storage device and a selection device coupled to the storage device,
the selection device including:
a first electrode;
a second electrode opposed to the first electrode;
a semiconductor layer provided between the first electrode and the second electrode, and including at least one kind of chalcogen element selected from tellurium (Te), selenium (Se), and sulfur (S), and at least one kind of first element selected from boron (B), aluminum (Al), gallium (Ga), phosphorus (P), arsenic (As), carbon (C), germanium (Ge), and silicon (Si); and
a first heat bypass layer provided at least in a portion around the semiconductor layer between the first electrode and the second electrode and having higher thermal conductivity than the semiconductor layer.

(9)
The storage apparatus according to (8), in which an electrothermal insulating layer is provided between adjacent ones of the selection devices.

(10)
The storage apparatus according to (9), in which the electrothermal insulating layer is provided between adjacent ones of the plurality of memory cells.

(11)
The storage apparatus according to (9) or (10), in which the electrothermal insulating layer includes an alloy including a material included in the semiconductor layer, silicon oxide ($SiO_2$), or silicon nitride ($Si_3N_4$).

(12)
The storage apparatus according to any one of (8) to (11), in which the storage device includes any of a phase-change storage device, a resistance-change storage device, and a magnetoresistive storage device.

(13)
The storage apparatus according to any one of (8) to (12), in which two or more of the plurality of memory cells are stacked.

This application claims the benefit of Japanese Priority Patent Application JP2017-091113 filed with the Japan Patent Office on May 1, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A selection device, comprising:
a first electrode;
a second electrode opposite to the first electrode;
a semiconductor layer between the first electrode and the second electrode, wherein the semiconductor layer includes at least one kind of a chalcogen element selected from tellurium (Te), selenium (Se), and sulfur (S), and at least one kind of first element selected from boron (B), aluminum (Al), gallium (Ga), phosphorus (P), arsenic (As), carbon (C), germanium (Ge), and silicon (Si); and a first heat bypass layer at least in a portion around the semiconductor layer, wherein
- a thermal conductivity of the first heat bypass layer is higher than a thermal conductivity of the semiconductor layer and
- a product of the thermal conductivity of the first heat bypass layer and a cross-sectional area of the first heat bypass layer is greater than a product of the thermal conductivity of the semiconductor layer and a cross-sectional area of the semiconductor layer.

2. The selection device according to claim 1, wherein the semiconductor layer further includes at least one kind of a second element selected from oxygen (O) and nitrogen (N).

3. The selection device according to claim 1, wherein
the first heat bypass layer includes an alloy, and
the alloy includes one of silicon oxide ($SiO_2$) or silicon nitride ($Si_3N$) doped with carbon (C), boron (B) or phosphorus (P), aluminum oxide ($Al_2O$), cerium oxide ($CeO_2$), zircon oxide ($ZrO_2$), silicon carbide (SiC), beryllium oxide (BeO), zinc oxide (ZnO), titanium oxide ($TiO_2$), boron arsenide (BAs), antimony boride (BSb), boron phosphide (BP), and boron nitride (BN).

4. The selection device according to claim 1, wherein the semiconductor layer is changed to a low resistance state based on an applied voltage equal to or higher than a threshold voltage and is changed to a high resistance state based on the applied voltage smaller than the threshold voltage without phase change between an amorphous phase and a crystal phase.

\* \* \* \* \*